US011893920B2

(12) United States Patent
Cha et al.

(10) Patent No.: US 11,893,920 B2
(45) Date of Patent: Feb. 6, 2024

(54) DISPLAY DEVICE

(71) Applicant: Samsung Display Co., LTD., Yongin-si (KR)

(72) Inventors: Na Hyeon Cha, Yongin-si (KR); Sun Kwun Son, Yongin-si (KR); Dong Hee Shin, Yongin-si (KR); Chong Chul Chai, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/834,480

(22) Filed: Jun. 7, 2022

(65) Prior Publication Data

US 2023/0075783 A1    Mar. 9, 2023

(30) Foreign Application Priority Data

Sep. 3, 2021    (KR) ........................ 10-2021-0117745

(51) Int. Cl.
*G09G 3/20*    (2006.01)

(52) U.S. Cl.
CPC ....... *G09G 3/20* (2013.01); *G09G 2310/0267* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 9,542,901 | B2* | 1/2017 | Kim ..................... | G09G 3/3677 |
| 10,276,123 | B2 | 4/2019 | Park et al. | |
| 10,403,207 | B2* | 9/2019 | Kang ................... | G09G 3/3225 |
| 10,504,602 | B2* | 12/2019 | Yao ...................... | G11C 19/287 |
| 11,308,872 | B2* | 4/2022 | Kim ..................... | G09G 3/3233 |
| 2007/0104307 | A1* | 5/2007 | Kim ........................ | G11C 19/28 |
| | | | | 377/64 |
| 2012/0249518 | A1* | 10/2012 | Won ..................... | H04N 13/356 |
| | | | | 345/213 |
| 2013/0321499 | A1* | 12/2013 | Park ..................... | G09G 3/3275 |
| | | | | 345/698 |
| 2017/0117341 | A1* | 4/2017 | Chen .................... | H10K 59/123 |
| 2019/0164478 | A1* | 5/2019 | Kim ..................... | G09G 3/3266 |
| 2021/0375197 | A1* | 12/2021 | Dai .......................... | G09G 3/32 |
| 2022/0190093 | A1* | 6/2022 | No ....................... | G09G 3/3607 |

FOREIGN PATENT DOCUMENTS

KR    10-2016-0132280    11/2016

* cited by examiner

*Primary Examiner* — Dorothy Harris
(74) *Attorney, Agent, or Firm* — KILE PARK REED & HOUTTEMAN PLLC

(57) ABSTRACT

A display device includes a display panel including pixels in a display area, scan lines disposed in the display area and electrically connected to the pixels, a gate driving circuit disposed in the display area and electrically connected to the scan lines, and clock lines disposed in the display area and electrically connected to the gate driving circuit. The gate driving circuit includes stage blocks adjacent to each other and outputting a scan signal in response to a clock signal provided through a corresponding clock line among the clock lines, and a scan signal output from a stage block among the stage blocks is supplied to scan lines of another stage block among the stage blocks.

20 Claims, 17 Drawing Sheets

DISPLAY DEVICE

CROSS-REFERENCE TO RELATED APPLICATION(S)

This application claims priority to and benefits of Korean Patent Application No. 10-2021-0117745 under 35 U.S.C. § 119, filed on Sep. 3, 2021 in the Korean Intellectual Property Office, the entire contents of which are incorporated herein by reference.

BACKGROUND

1. Technical Field

The disclosure relates to a display device.

2. Description of the Related Art

As interest in an information display is increasing and a demand for using a portable information media is increasing, a demand and commercialization for a display device are being focused upon currently.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device that minimizes a non-display area and improves quality of the display device.

According to an embodiment, a display device may include a display panel including pixels in a display area; scan lines disposed in the display area and electrically connected to the pixels; a gate driving circuit disposed in the display area and electrically connected to the scan lines; and clock lines disposed in the display area and electrically connected to the gate driving circuit. The gate driving circuit may include stage blocks adjacent to each other and outputting a scan signal in response to a clock signal provided through a corresponding clock line among the clock lines, and a scan signal output from a stage block among the stage blocks is supplied to scan lines of another stage block among the stage blocks.

A scan signal output from an n-th stage block among the stage blocks may be supplied to scan lines of an (n−1)-th stage block.

A scan signal output from an n-th stage block among the stage blocks may be supplied to scan lines of an (n+1)-th stage block.

A scan signal output from an (n−2)-th stage block among the stage blocks may be supplied to scan lines of an n-th stage block.

A scan signal output from an (n−1)-th stage block among the stage blocks may be supplied to scan lines of an (n+1)-th stage block.

A scan signal output from the n-th stage block among the stage blocks may be supplied to scan lines of the (n−2)-th stage block.

A scan signal output from the (n+1)-th stage block among the stage blocks may be supplied to scan lines of the (n−1)-th stage block.

A stage block among the stage blocks may include eight stages adjacent to each other in a direction.

The clock lines may include a first scan clock line, a second scan clock line, a third scan clock line, a fourth scan clock line, a fifth scan clock line, a sixth scan clock line, a seventh scan clock line, and an eighth scan clock line, the first scan clock line, the second scan clock line, the third scan clock line, the fourth scan clock line, the fifth scan clock line, the sixth scan clock line, the seventh scan clock line, and the eighth scan clock line may be electrically connected to the eight stages, respectively, and each of the eight stages may output the scan signal in response to a scan clock signal provided through the first scan clock line, the second scan clock line, the third scan clock line, the fourth scan clock line, the fifth scan clock line, the sixth scan clock line, the seventh scan clock line, and the eighth scan clock line.

The scan lines may include a first scan line, a second scan line, a third scan line, a fourth scan line, a fifth scan line, a sixth scan line, a seventh scan line, and an eighth scan line, and the first scan line, the second scan line, the third scan line, the fourth scan line, the fifth scan line, the sixth scan line, the seventh scan line, and the eighth scan line may be scan lines of the another stage block among the stage blocks.

According to an embodiment, a display device may include a display panel including unit areas in which pixel rows and pixel columns are disposed; scan lines disposed in the unit areas and electrically connected to the pixel rows; output scan lines disposed in at least one unit area among the unit areas; and a gate driving circuit including gate driving elements disposed in the unit areas, and outputting a scan signal by the gate driving elements. A scan signal output from a unit area among the unit areas may be supplied to scan lines of another unit area among the unit areas through an output scan line among the output scan lines.

A scan signal output from an n-th unit area among the unit areas may be supplied to scan lines of an (n−1)-th unit area among the unit areas through a first output scan line among the output scan lines, and the first output scan line may be disposed in the n-th unit area and the (n−1)-th unit area.

A scan signal output from an n-th unit area among the unit areas may be supplied to scan lines of an (n+1)-th unit area among the unit areas through a second output scan line among the output scan lines, and the second output scan line may be disposed in the n-th unit area and the (n+1)-th unit area.

A scan signal output from an (n−2)-th unit area among the unit areas may be supplied to scan lines of an n-th unit area among the unit areas through a third output scan line among the output scan lines, and the third output scan line may be disposed over the (n−2)-th unit area to the n-th unit area.

A scan signal output from an (n−1)-th unit area among the unit areas may be supplied to scan lines of an (n+1)-th unit area among the unit areas through a fourth output scan line among the output scan lines, and the fourth output scan line may be disposed over the (n−1)-th unit area to the (n+1)-th unit area.

A scan signal output from the n-th unit area among the unit areas may be supplied to scan lines of an (n−2)-th unit area among the unit areas through a fifth output scan line among the output scan lines, and the fifth output scan line may be disposed over the n-th unit area to the (n−2)-th unit area.

A scan signal output from the (n+1)-th unit area among the unit areas may be supplied to scan lines of the (n−1)-th unit area through a sixth output scan line among the output scan lines, and the sixth output scan line may be disposed over the (n+1)-th unit area to the (n−1)-th unit area.

The display device may further include clock lines electrically connected to the gate driving circuit and supplying a clock signal corresponding to the gate driving circuit, and the gate driving circuit may output the scan signal in response to the clock signal.

The clock lines may include a first scan clock line, a second scan clock line, a third scan clock line, a fourth scan clock line, a fifth scan clock line, a sixth scan clock line, a seventh scan clock line, and an eighth scan clock line, the first scan clock line, the second scan clock line, the third scan clock line, the fourth scan clock line, the fifth scan clock line, the sixth scan clock line, the seventh scan clock line, and the eighth scan clock line may be electrically connected to the corresponding gate driving circuit, respectively, and the gate driving circuit may output the scan signal in response to the scan clock signal provided through the first scan clock line, the second scan clock line, the third scan clock line, the fourth scan clock line, the fifth scan clock line, the sixth scan clock line, the seventh scan clock line, and the eighth scan clock line.

The scan lines may include a first scan line, a second scan line, a third scan line, a fourth scan line, a fifth scan line, the sixth scan line, a seventh scan line, and an eighth scan line, and the first scan line, the second scan line, the third scan line, the fourth scan line, the fifth scan line, the sixth scan line, a seventh scan line, and the eighth scan line are scan lines of another unit area among the unit areas.

According to an embodiment, since a scan signal output from one stage block (or unit area) is output to a scan line electrically connected to another stage block (or another unit area), a voltage of the scan line of the corresponding stage block (or the corresponding unit area) may not be affected by a voltage change of a first node. Accordingly, stain of a display panel may be improved.

An effect according to an embodiment is not limited to contents described above, and more various effects are included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
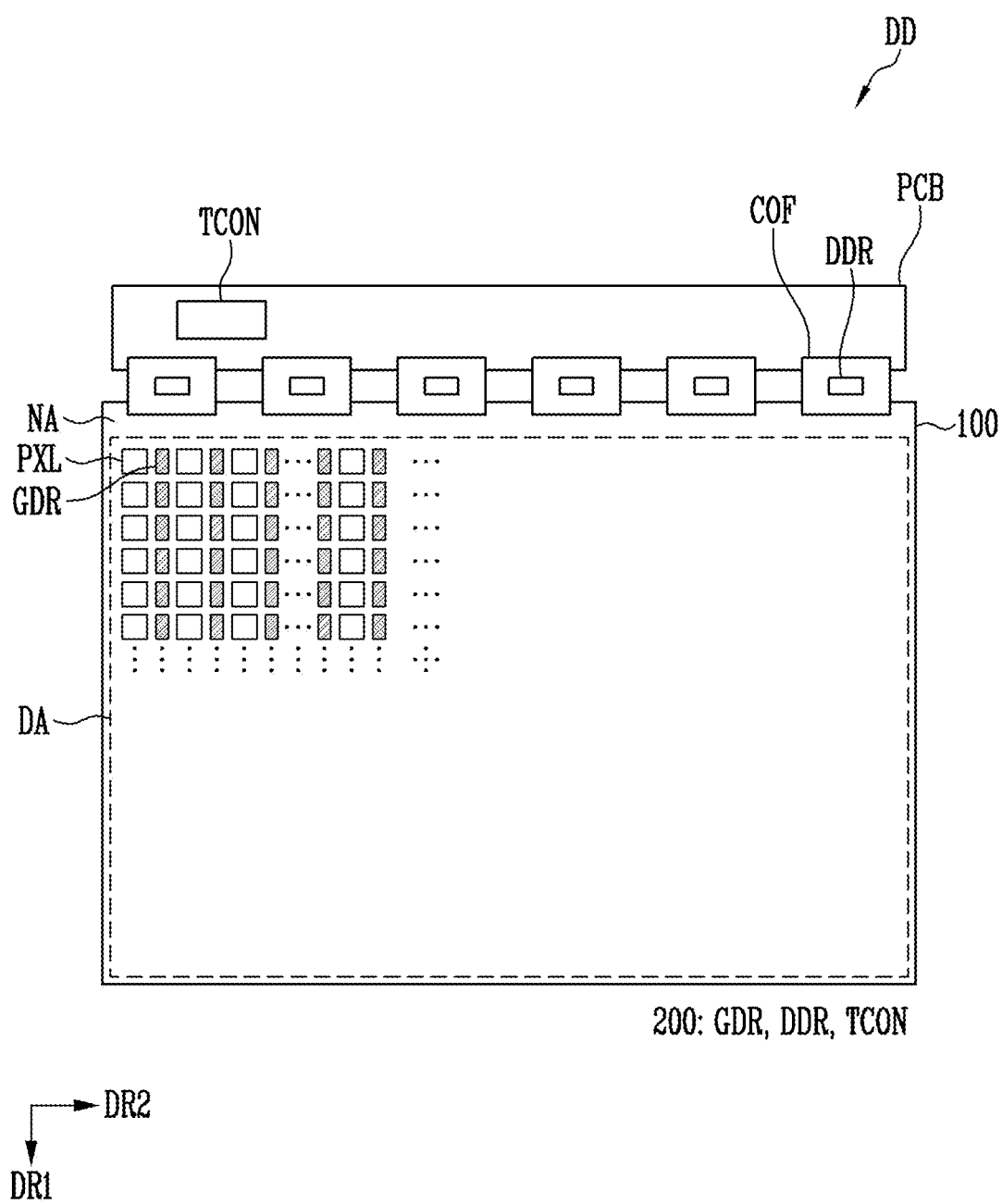
FIG. 1 is a schematic plan view illustrating a display device according to an embodiment.

The disclosure may be variously modified and have various forms. Therefore, embodiments will be illustrated in the drawings and will be described in detail in the specification. However, it should be understood that the disclosure is not intended to be limited to the disclosed embodiments, and the disclosure includes all modifications, equivalents, and substitutions within the spirit and technical scope of the disclosure.

In the drawings, sizes, thicknesses, ratios, and dimensions of the elements may be exaggerated for ease of description and for clarity. Like numbers refer to like elements throughout.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Terms of "first", "second", and the like may be used to describe various components, but the components should not be limited by the terms. The terms are used only for the purpose of distinguishing one component from another component. For example, without departing from the spirit and the scope of the disclosure, a first component may be referred to as a second component, and similarly, a second component may also be referred to as a first component.

The singular expressions include plural expressions unless the context clearly indicates otherwise. For example, as used herein, the singular forms, "a," "an," and "the" are intended to include the plural forms as well, unless the context clearly indicates otherwise.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, or the like are used to specify that there is a feature, a number, a step, an operation, a component, a part, or a combination thereof described in the specification, but does not exclude a possibility of the presence or addition of one or more other features, numbers, steps, operations, components, parts, or combinations thereof in advance.

In a case where a portion of a layer, a film, an area, a plate, or the like is referred to as being "on" another portion, it includes not only a case where the portion is "directly on" another portion, but also a case where there is further another portion between the portion and the other portion. In the specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" or "below" another portion, this includes not only a case where the portion is "directly beneath" another portion but also a case where there is further another portion between the portion and the other portion.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment is described with reference to the drawings related to the embodiments.

FIG. 1 is a schematic plan view illustrating a display device according to an embodiment.

Referring to FIG. 1, the display device DD according to an embodiment may include a display panel 100 and a panel driving circuit 200 for driving the display panel 100. The display device DD may include a circuit board PCB and a connection film COF for connecting the display panel 100 and the panel driving circuit 200.

The display panel 100 and the display device DD including the same may have various shapes. For example, the display panel 100 may be provided in a form of a plate having a quadrangle shape, and may include an angled or rounded corner portion. The display panel 100 may have another shape. According to an embodiment, the display panel 100 may have another polygonal shape, such as a hexagon or an octagon, or a shape including a curved perimeter, such as a circle or an ellipse, in a plan view. It is to be understood that the shapes disclosed herein may include shapes substantially identical or similar to the shapes.

The display panel 100 may include a display area DA displaying an image and a non-display area NA positioned at one side or a side of the display area DA.

Pixels PXL and a portion of the panel driving circuit 200 may be disposed in the display area DA. In an embodiment, the pixels PXL may include sub-pixels respectively emitting light of different colors. As a luminance of the light emitted from the sub-pixels of the pixel PXL is controlled, a color and a luminance of the light emitted from the pixel PXL may be controlled.

Pixel lines (for example, scan lines, data lines, a first driving power line, and a second driving power line) for supplying driving signals (for example, a scan signal and a data signal) and driving power (for example, first pixel power and second pixel power) to the pixels PXL may be disposed in the non-display area NA. A portion of the panel driving circuit 200 may be disposed in the non-display area NA.

The panel driving circuit 200 may include a gate driving circuit GDR, a data driving circuit DDR, and a timing controller TCON.

The gate driving circuit GDR may generate scan signals in response to a gate control signal supplied from the timing controller TCON, and may supply the generated scan signals (or gate signals) to the pixels PXL.

The gate driving circuit GDR may be dispersedly disposed in the display area DA. For example, at least one gate driving circuit GDR may be disposed between the pixels PXL. Accordingly, as the gate driving circuit GDR driving the pixels PXL is disposed in the display area DA, the display device DD according to an embodiment may minimize the non-display area NA.

The gate driving circuit GDR may include stages for sequentially outputting the scan signals, and each stage among the stages may include transistors and capacitors. For example, some or a number of the transistors and the capacitors forming the gate driving circuit GDR may be dispersedly disposed in the display area DA.

The gate driving circuit GDR may be uniformly dispersed along a first direction DR1 and a second direction DR2 in the display area DA as shown in FIG. 1. The disclosure is not limited thereto, and according to an embodiment, the gate driving circuit GDR may be non-uniformly dispersed between the pixels PXL. For example, according to an embodiment, the gate driving circuit GDR may be disposed in various shapes in the display area DA.

The data driving circuit DDR may generate data signals (or data voltages) in response to image data and a data control signal supplied from the timing controller TCON, and supply the generated data signals to the pixels PXL.

The timing controller TCON may supply the gate control signal to the gate driving circuit GDR to control an operation of the gate driving circuit GDR. The timing controller TCON may supply the image data and the data control signal to the data driving circuit DDR to control an operation of the data driving circuit DDR.

The connection film COF may partially overlap the display panel 100 and the circuit board PCB. For example, the connection film COF may be a chip on film. The data driving circuit DDR may be mounted on the connection film COF. The connection film COF may overlap pads (not shown) disposed in the non-display area NA of the display panel 100. Accordingly, the connection film COF may electrically connect the data driving circuit DDR and the pixels PXL through the pads of the non-display area NA.

The circuit board PCB may partially overlap the connection film COF. For example, the circuit board PCB may be a flexible printed circuit board. The timing controller TCON may be mounted on the circuit board PCB. The timing controller TCON may be electrically connected to the data driving circuit DDR and the gate driving circuit GDR through the circuit board PCB and the connection film COF.

Hereinafter, a tiled display device is described with reference to FIG. 2.

Figure 2:
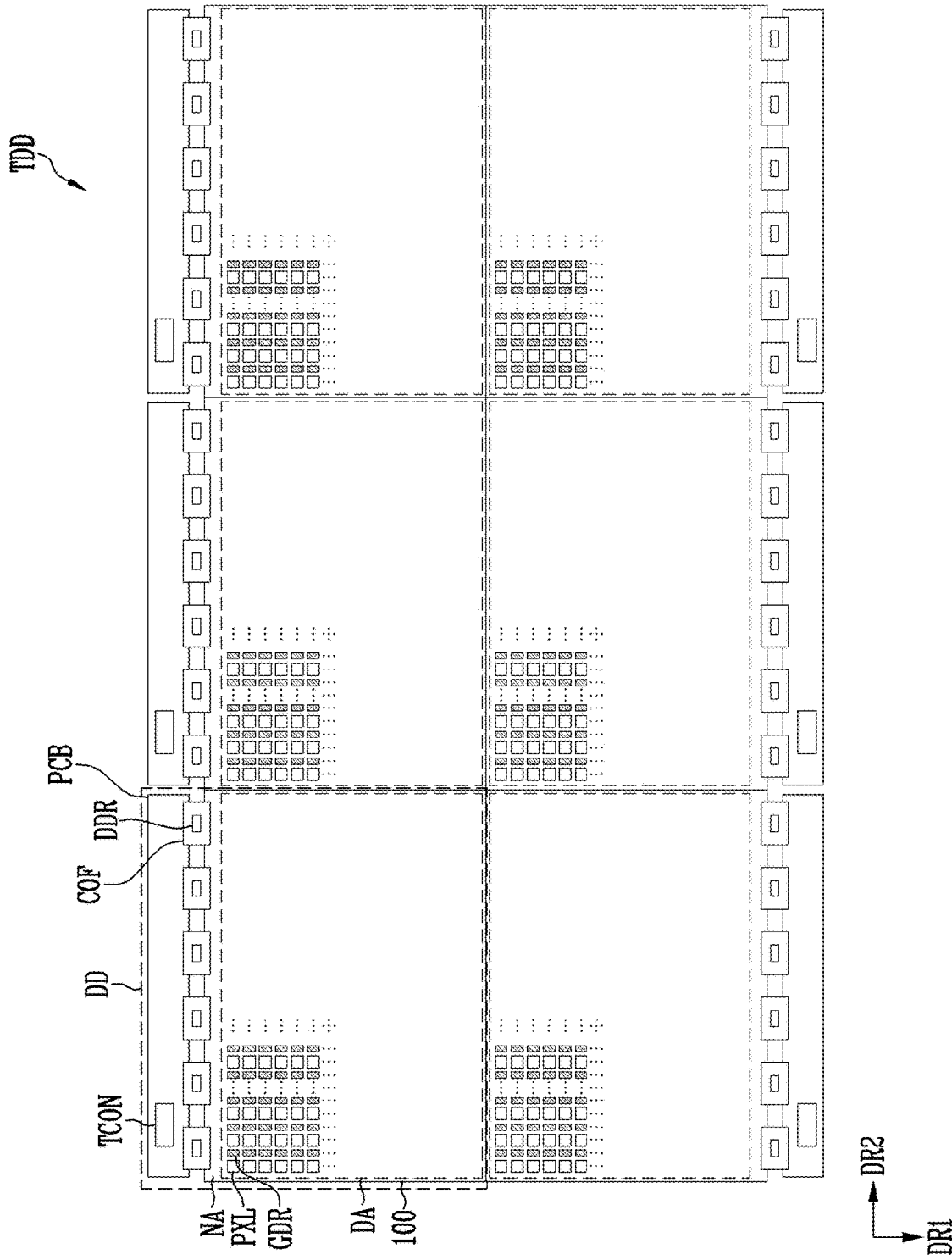
FIG. 2 is a schematic plan view illustrating a tiled display device of a display device according to an embodiment.

FIG. 2 is a schematic plan view illustrating a tiled display device of a display device according to an embodiment.

Referring to FIG. 2, the tiled display device TDD may be formed by connecting a display device DD according to an embodiment. The tiled display device may implement a large screen by arranging the display devices DD along the first direction DR1 and/or the second direction DR2. Each of the display devices DD may display an independent image. As an example, the display devices DD may display an image connected to each other to display one image on the tiled display device TDD.

The display device DD forming the tiled display device TDD may include the panel driving circuit 200 positioned on only one side or a side of the non-display area NA. For example, in the display device DD, the data driving circuit DDR and the timing controller TCON may be positioned on one side or a side (for example, an upper side or a lower side) of the non-display area NA, and the gate driving circuit GDR may be positioned in the display area DA. Accordingly, the display device DD may minimize the non-display area NA, and the tiled display device TDD may implement a seamless tiled display device.

Hereinafter, a pixel included in a display device according to an embodiment is described with reference to FIG. 3.

Figure 3:
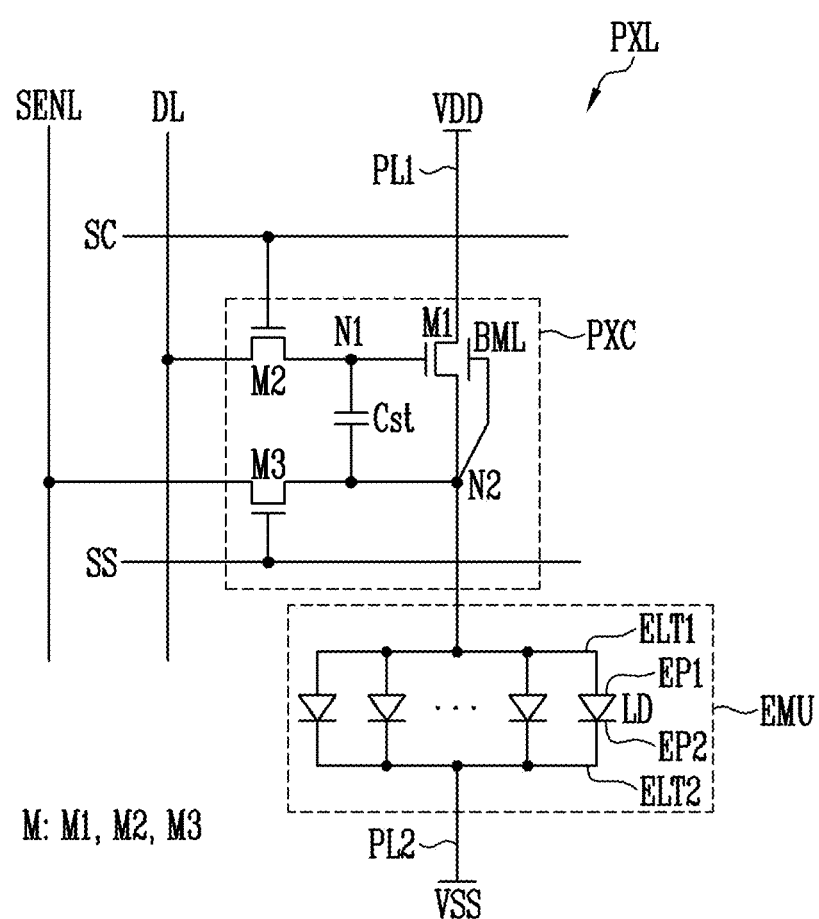
FIG. 3 is a schematic diagram of an equivalent circuit of a pixel included in a display device according to an embodiment.

FIG. 3 is a schematic diagram of an equivalent circuit of a pixel included in a display device according to an embodiment.

Referring to FIG. 3, the pixel PXL according to an embodiment may include a light emitting unit EMU for generating light of a luminance corresponding to the data signal and a pixel circuit unit PXC for driving the light emitting unit EMU.

The light emitting unit EMU may be connected between first power VDD and second power VSS, and may include a first electrode ELT1, a second electrode ELT2, and a light emitting element LD.

The first electrode ELT1 may be connected to the first power VDD through the pixel circuit unit PXC and a first power line PL1, and the second electrode ELT2 may be connected to the second power VSS through a second power line PL2. For example, the first power VDD may be high potential pixel power, the second power VSS may be low potential pixel power, and a difference between the first power VDD and the second power VSS may be equal to or greater than a threshold voltage of the light emitting element LD.

Light emitting elements LD may be connected in series and/or in parallel between the first electrode ELT1 and the second electrode ELT2. A first end EP1 of the light emitting elements LD may be connected to the first electrode ELT1, and a second end EP2 may be connected to the second electrode ELT2.

The pixel circuit unit PXC may include a first transistor M1, a second transistor M2, a third transistor M3, and a storage capacitor Cst.

The first transistor M1 (or a driving transistor) may include a gate electrode connected to a first node N1, a first electrode connected to the first power line PL1, and a second electrode connected to a second node N2. For example, the second node N2 may be a node to which one electrode (for example, a source electrode) of the first transistor M1 and the first electrode ELT1 (for example, an anode electrode) of the light emitting unit EMU are connected. The first transistor M1 may control a driving current supplied to the light emitting unit EMU in response to a voltage of the first node N1.

In an embodiment, the first transistor M1 may further include a bottom metal layer (BML) (or a back gate electrode). The BML may be connected to the second electrode (for example, a source electrode) of the first transistor M1.

The second transistor M2 (or a switching transistor) may include a gate electrode connected to a scan line SC, a first electrode connected to a data line DL, and a second electrode connected to the first node N1. The second transistor M2 may be turned on in case that a first scan signal (for example, a gate-on voltage) is supplied from the scan line SC, to connect the data line DL and the first node N1.

The third transistor M3 (or a sensing transistor) may include a gate electrode connected to a sensing control line SS, a first electrode connected to a sensing line SENL, and a second electrode connected to the second node N2. The third transistor M3 may be turned on in case that a second scan signal (for example, a gate-on voltage) is supplied from the sensing control line SS, to transmit a reference voltage (or an initialization voltage), which is supplied to the sensing line SENL, to the second node N2, or transmit a voltage of the second node N2 to the sensing line SENL.

A first electrode of the storage capacitor Cst may be connected to the first node N1, and a second electrode may be connected to the second node N2. The storage capacitor Cst may charge a voltage corresponding to a difference between the data signal supplied to the first node N1 and the initialization voltage supplied to the second node N2 during each frame period.

In FIG. 3, all of the transistors M included in the pixel circuit unit PXC are N-type transistors, but the disclosure is not limited thereto. According to an embodiment, at least one of the first, second, and third transistors M1, M2, and M3 may be changed to a P-type transistor.

Hereinafter, a gate driving circuit according to an embodiment is described with reference to FIGS. 4 to 6.

Figure 4:
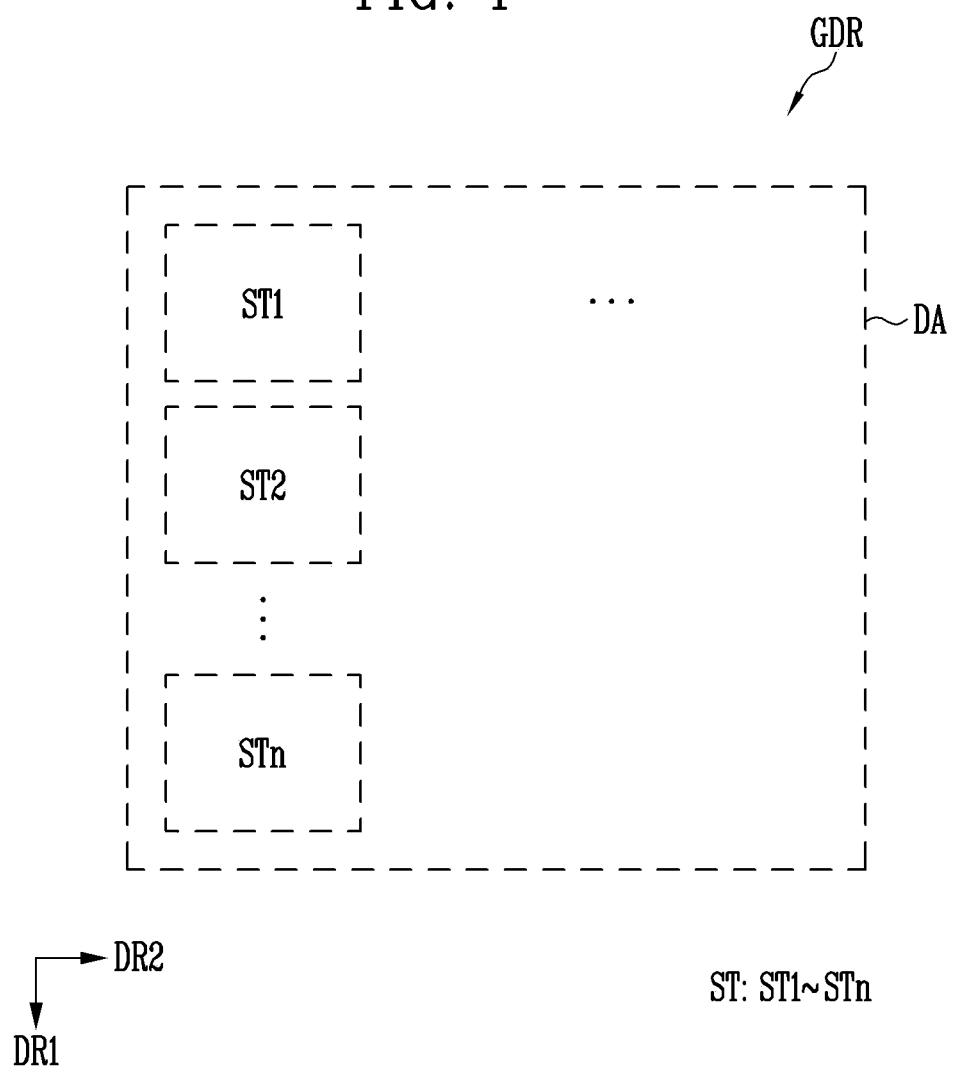
FIG. 4 is a schematic plan view illustrating an example of a gate driving circuit according to an embodiment.
Figure 5:
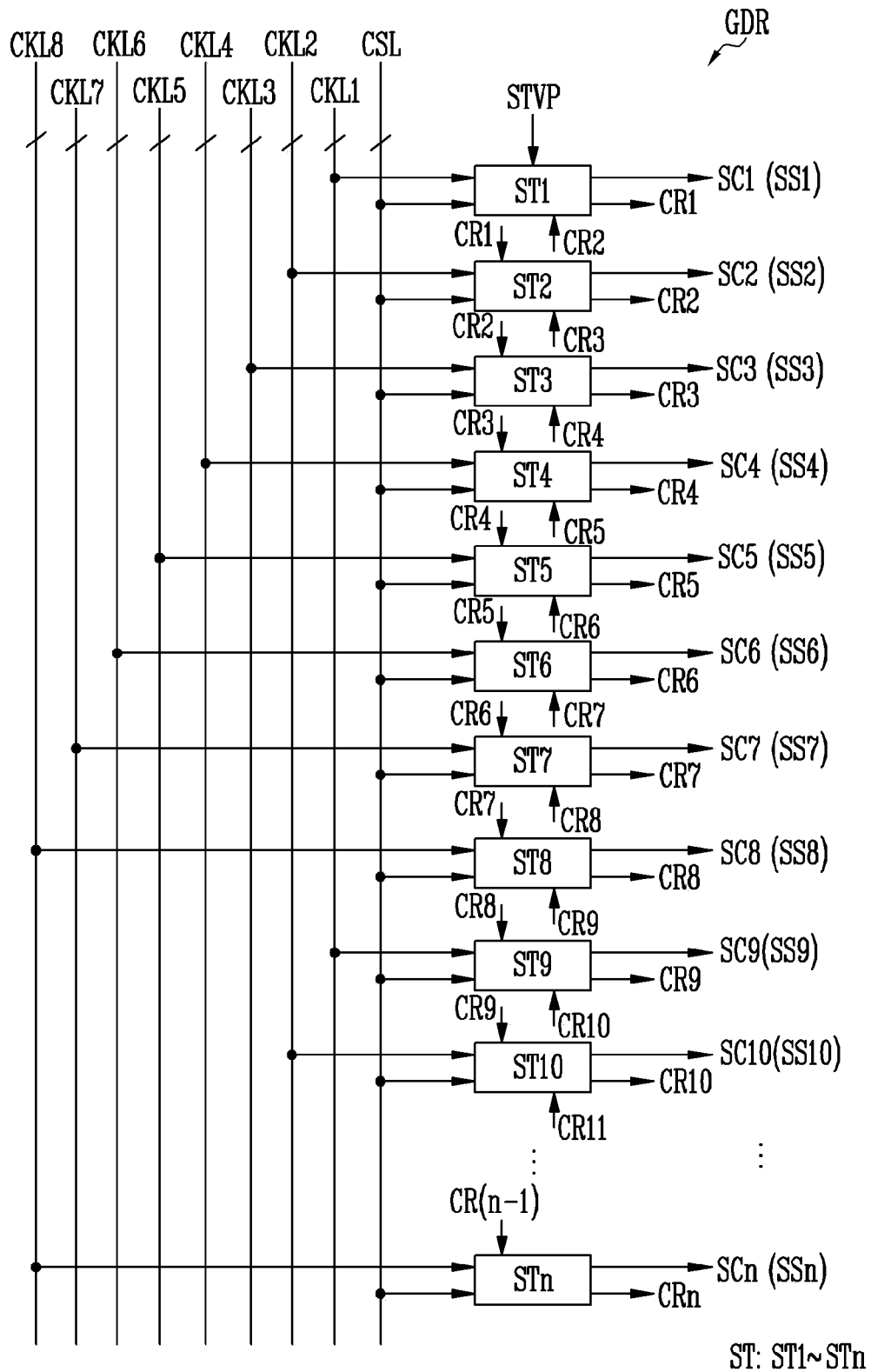
FIG. 5 is a block diagram illustrating a gate driving circuit according to an embodiment.
Figure 6:
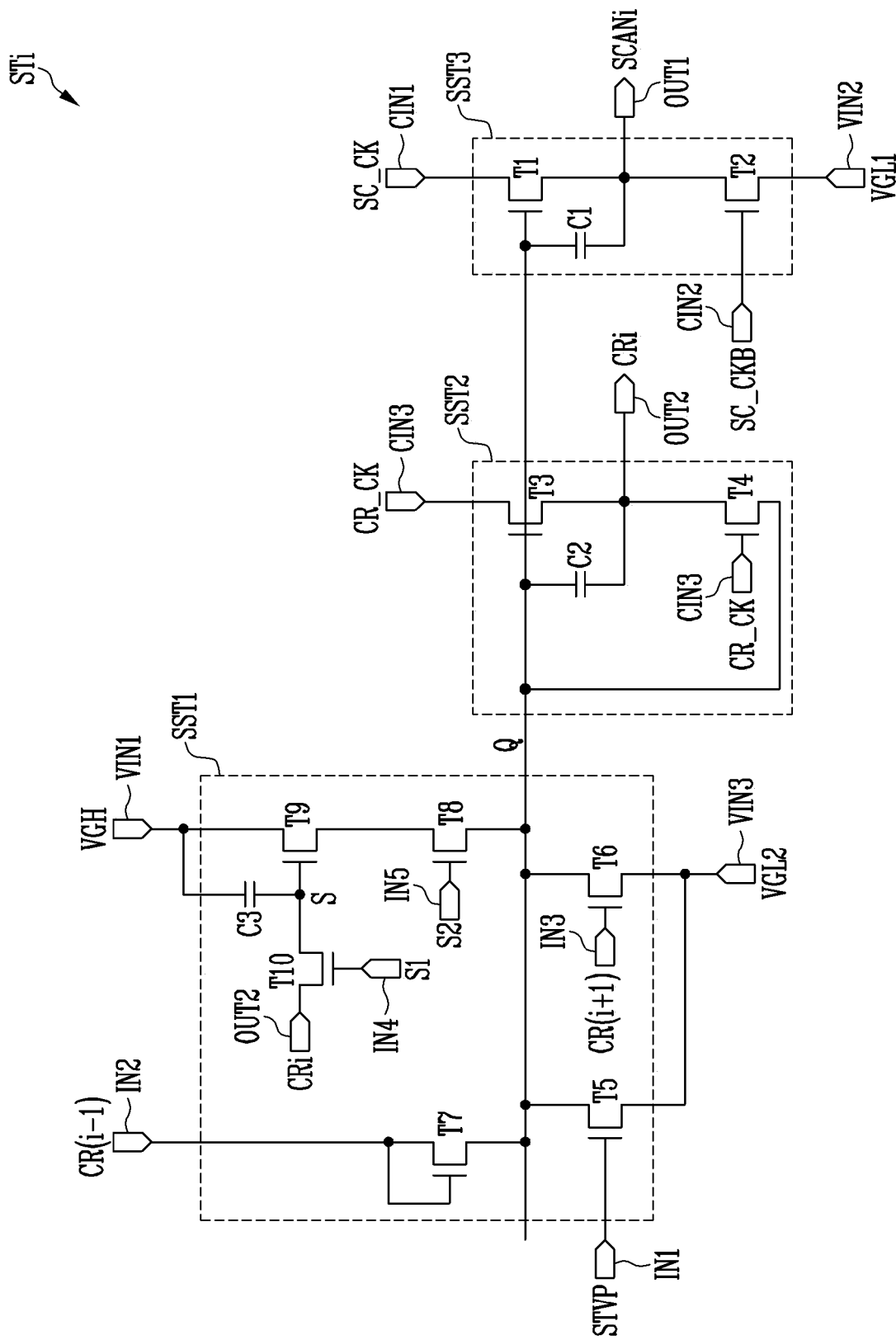
FIG. 6 is a circuit illustrating an i-th stage circuit of FIG. 5.

FIG. 4 is a schematic plan view illustrating an example of a gate driving circuit according to an embodiment, FIG. 5 is a block diagram illustrating a gate driving circuit according to an embodiment, and FIG. 6 is a circuit illustrating an i-th stage of FIG. 5.

Referring to FIG. 4, the gate driving circuit GDR according to an embodiment may include stages ST.

The stages ST may include a first stage ST1 and a second stage ST2 to an n-th stage STn disposed in the display area DA. Here, the display area DA may be the display area DA of the display panel 100 (refer to FIGS. 1 and 2) described with reference to FIGS. 1 and 2.

For example, the first stage ST1 and the second stage ST2 to the n-th stage STn may be sequentially disposed to be spaced apart from each other in the first direction DR1. The disclosure is not limited thereto, and the first stage ST1 and the second stage ST2 to the n-th stage STn may be sequentially disposed to be spaced apart from each other in the second direction DR2, and may be disposed in various shapes along the first direction DR1 and the second direction DR2.

The first stage ST1 and the second stage ST2 to the n-th stage STn may be dependently connected to each other. For example, the first stage ST1 may be connected to an input terminal of a start pulse, the second stage ST2 may be connected to an output terminal of the first stage ST1, and thus the second stage ST2 may output a scan signal in response to an output of the first stage ST1.

Referring to FIG. 5, the gate driving circuit GDR according to an embodiment may include stages ST respectively connected to scan lines SC1 to SCn and/or sensing control lines SS1 to SSn, and carry lines CR1 to CRn. Here, the scan lines SC1 to SCn and the sensing control lines SS1 to SSn may correspond to the scan line SC and the sensing control line SS described with reference to FIG. 3, respectively.

The stages ST may be connected to corresponding clock lines and control lines CSL among clock lines CKL1 to CKL8. For example, a first stage ST1 may be connected to first clock lines CKL1, and a second stage ST2 may be connected to second clock lines CKL2. A third stage ST3 to an eighth stage ST8 may be sequentially connected to third clock lines CKL3 to eighth clock lines CKL8. A ninth stage ST9 may be connected to the first clock lines CKL1 again. As described above, in an embodiment, eight clock lines may be sequentially and repeatedly connected to an (n−8)-th stage to an n-th stage.

The clock lines CKL1, CKL2, CKL3, CKL4, CKL5, CKL6, CKL7 to CKL8 may include the first clock lines CKL1 to the eighth clock lines CKL8, and each of the first clock lines CKL1 to the eighth clock lines CKL8 may include a scan clock line and a carry clock line to be described later. However, this is an example, and the number of the clock lines CKL1 to CKL8 is not limited thereto. For example, the clock lines CKL1 to CKL8 may include the first clock lines CKL1 to the sixth clock lines CKL6 may not include the seventh clock lines CKL7 and the eighth clock lines CKL8. According to the number of the clock lines, the number of stages may also be changed.

First to eighth scan clock lines among the clock lines CKL1 to CKL8 may be electrically connected to eight stages, respectively, and first to eighth carry clock lines may be electrically connected to the eight stages, respectively. Accordingly, each of the eight stages may output a scan signal in response to a scan clock signal provided through the first to eighth scan clock lines, and may output a carry signal in response to a carry clock signal provided through the first to eighth carry clock lines.

Control lines CSL may include power lines to which driving power required for each operation of first to n-th stages ST1 to STn are applied. For example, the control lines CSL may include a gate high voltage line, a first gate low voltage line, a second gate low voltage line, a first control signal line, and a second control signal line. According to an embodiment, the control lines CSL may further include a reset control line or the like for resetting the first to n-th stages ST1 to STn.

Referring to FIG. 6, an i-th stage STi according to an embodiment may include a node control circuit SST1, a carry output circuit SST2, and a scan output circuit SST3. Here, the i-th stage STi may correspond to one of the first to n-th stages ST1 to STn of FIG. 5.

The node control circuit SST1 may control a first node Q based on a previous carry signal CR(i−1) (or a start pulse STVP) and clock signals CR_CK, SC_CK, and SC_CKB. For example, in case that the previous carry signal CR(i−1) has a gate-off voltage (for example, a low-level voltage), the node control circuit SST1 may control so that a voltage of the first node Q has a low-level voltage.

The node control circuit SST1 may initialize the voltage of the first node Q based on a next carry signal CR(i+1). For example, the i-th stage STi may initialize the voltage of the first node Q using the next carry signal CR(i+1) so as to output an i-th carry signal CRi and an i-th scan signal SCANi each having a high-level voltage in a corresponding horizontal period and so as not to output the i-th carry signal CRi and the i-th scan signal SCANi each having the high-level voltage after the corresponding horizontal period. According to an embodiment, the node control circuit SST1 may initialize the first node Q based on a separate reset signal or the like provided from the outside.

The node control circuit SST1 may include a fifth transistor T5, a sixth transistor T6, a seventh transistor T7, an eighth transistor T8, a ninth transistor T9, a tenth transistor T10, and a third capacitor C3.

The fifth transistor T5 may include a first electrode connected to the first node Q, a second electrode connected to a third power input terminal VIN3 to which a second gate low voltage VGL2 is input, and a gate electrode connected to a first input terminal IN1 to which the start pulse STVP is input. The fifth transistor T5 may be turned on in response to the start pulse STVP of a high-level voltage, to transmit the second gate low voltage VGL2 to the first node Q. Accordingly, a voltage of the first node Q may be initialized or reset to the second gate low voltage VGL2. According to an embodiment, the first node Q may be initialized or reset by using the start pulse STVP as an initialization signal (or a reset signal).

The sixth transistor T6 may include a first electrode connected to the first node Q, a second electrode connected to the third power input terminal VIN3, and a gate electrode connected to a third input terminal IN3 to which the next carry signal CR(i+1) is input. The sixth transistor T6 may be turned on in response to the next carry signal CR(i+1) of a high-level voltage, to transmit the second gate low voltage VGL2 to the first node Q. For example, the voltage of the first node Q may be changed from a high-level voltage to a low-level voltage or reset by the next carry signal CR(i+1).

The seventh transistor T7 may include a first electrode and a gate electrode connected to a second input terminal IN2 to which the previous carry signal CR(i−1) is input, and a second electrode connected to the first node Q. The seventh transistor T7 may transmit the previous carry signal CR(i−1) to the first node Q in response to the previous carry signal CR(i−1). For example, in case that the previous carry signal CR(i−1) is a high-level voltage, the voltage of the first node Q may be changed to or maintained as the high-level voltage.

The eighth transistor T8 may include a first electrode connected to a second electrode of a ninth transistor T9 to be described later, a second electrode connected to a first node Q, and a gate electrode connected to a fifth input terminal IN5 to which a second control signal S2 is input.

The ninth transistor T9 may include a first electrode connected to a first power input terminal VIN1 to which a gate high voltage VGH is input, the second electrode connected to the first electrode of the eighth transistor T8, and a gate electrode connected to a second S.

The tenth transistor T10 may include a first electrode connected to a second output terminal OUT2 to which an i-th carry signal CRi is output, a second electrode connected to the second node S, and a gate electrode connected to a fourth input terminal IN4 to which a first control signal Si is input.

The third capacitor C3 may be connected between the first power input terminal VIN1 to which the gate high voltage VGH is input and the second node S.

The eighth to tenth transistors T8 to T10 and the third capacitor C3 may be elements added to selectively drive only a specific stage (or pixels PXL of a specific horizontal line connected to the specific stage).

Regarding a driving method using the eighth to tenth transistors T8 to T10 and the third capacitor C3, in case that a first control signal Si of a high-level voltage is applied to the fourth input terminal IN4, the i-th carry signal CRi may be transmitted to the second node S through the tenth transistor T10. Accordingly, the third capacitor C3 may store the i-th carry signal CRi of the high-level voltage, and the ninth transistor T9 may be turned on. According to an embodiment, remaining stages except for the i-th stage STi may output a carry signal of a low-level voltage, and thus the ninth transistors T9 of the remaining stages may maintain a turn-off state.

Thereafter, in case that a second control signal S2 of a high-level voltage is applied to the fifth input terminal IN5, the eighth transistor T8 may be turned on. In case that the ninth transistor T9 is turned on, the gate high voltage VGH may be applied to the first node Q through the eighth transistor T8 and the ninth transistor T9. The i-th stage STi may output an i-th scan signal SCANi to a first output terminal OUT1 through a first transistor T1 to be described later in response to the voltage of the first node Q. The ninth transistors T9 of stages except for a selected stage may maintain a turned-off state. Accordingly, the remaining stages may not output scan signals.

The carry output circuit SST2 may output a carry clock signal CR_CK, which is input to a third clock input terminal CIN3, to the second output terminal OUT2 as the i-th carry signal CRi, in response to the voltage of the first node Q.

The carry output circuit SST2 may include a third transistor T3, a fourth transistor T4, and a second capacitor C2.

The third transistor T3 may include a first electrode connected to the third clock input terminal CIN3, a second electrode connected to the second output terminal OUT2, and a gate electrode connected to the first node Q. The third transistor T3 may be turned on in case that the voltage of the first node Q is a high-level voltage, to output the carry clock signal CR_CK, which is input to the third clock input terminal CIN3, to the second output terminal OUT2 as the i-th carry signal CRi.

The fourth transistor T4 may include a first electrode connected to the second output terminal OUT2, a second electrode connected to the first node Q, and a gate electrode connected to the third clock input terminal CIN3. The fourth transistor T4 may be turned on in response to a carry clock signal CR_CK of a high-level voltage, and may pull down or maintain a voltage of the i-th carry signal CRi using the voltage of the first node Q.

The second capacitor C2 may be connected between the gate electrode of the third transistor T3 and the second output terminal OUT2. The second capacitor C2 may boost the i-th carry signal CRi of the high-level voltage.

The scan output circuit SST3 may output a scan clock signal SC_CK, which is input to a first clock input terminal CIN1, to the first output terminal OUT1 as the i-th scan signal SCANi, in response to the voltage of the first node Q. The scan output circuit SST3 may pull down or maintain a voltage of the first output terminal OUT1 as a first gate low voltage VGL1 in response to an inversion scan clock signal SC_CKB input to a second clock input terminal CIN2.

The second output circuit SST3 may include the first transistor T1, a second transistor T2, and a first capacitor C1.

The first transistor T1 may include a first electrode connected to the first clock input terminal CIN1, a second electrode connected to the first output terminal OUT1, and a gate electrode connected to the first node Q. In case that the first node voltage is a high-level voltage, the first transistor T1 may output the scan clock signal SC_CK to the first output terminal OUT1 as the i-th scan signal SCANi.

The second transistor T2 may include a first electrode connected to the first output terminal OUT1, a second electrode connected to a second power input terminal VIN2 to which a first gate low voltage VGL1 is input, and a gate electrode connected to the second clock input terminal CIN2 to which the inversion scan clock signal SC_CKB is input. The second transistor T2 may be turned on in response to an inversion scan clock signal SC_CKB of a high-level voltage, and pull down or maintain the voltage of the first output terminal OUT1 as the first gate low voltage VGL1. For example, the scan clock signal SC_CK and the inversion scan clock signal SC_CKB may have opposite waveforms (for example, waveforms having a phase difference of 180 degrees).

The first capacitor C1 may be connected between the gate electrode of the first transistor T1 and the first output terminal OUT1. The first capacitor C1 may boost the i-th carry signal CRi of the high-level voltage.

Hereinafter, a pixel structure of a display device according to an embodiment is described with reference to FIGS. 7 and 8.

Figure 7:
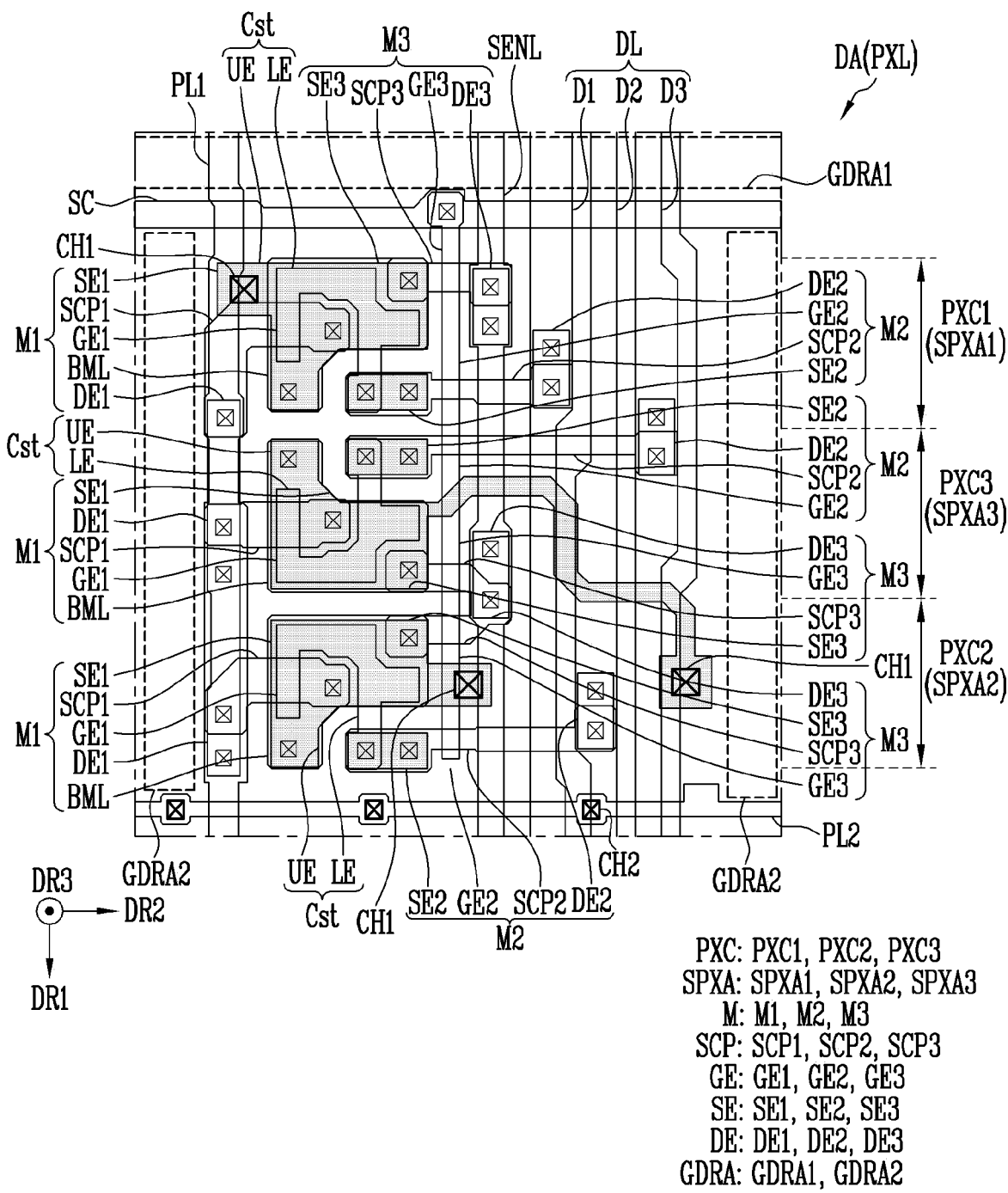
FIG. 7 is a schematic plan view illustrating a pixel according to an embodiment.
Figure 8:
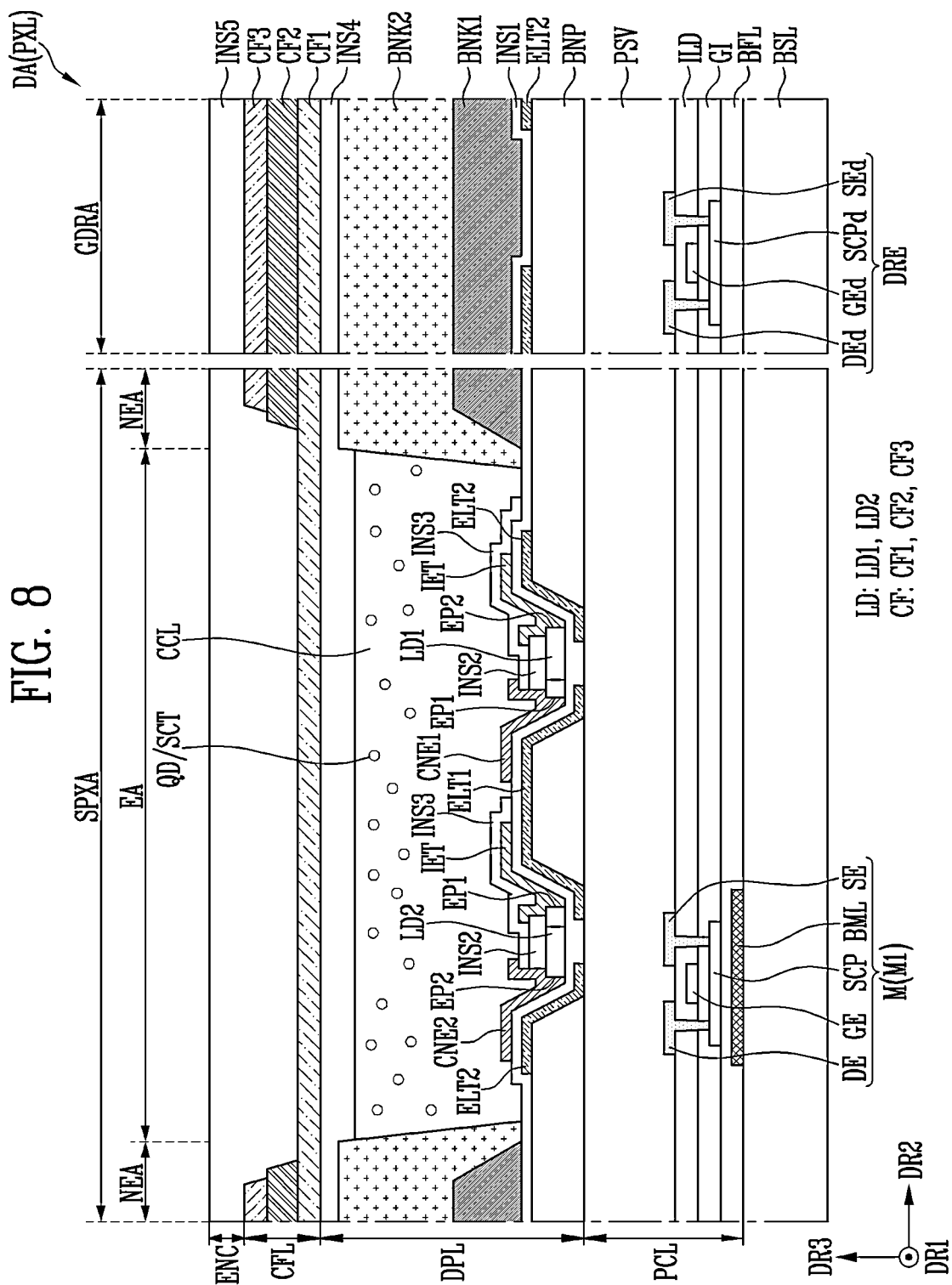
FIG. 8 is a schematic cross-sectional view illustrating a pixel according to an embodiment.

FIG. 7 is a schematic plan view illustrating a pixel according to an embodiment, and FIG. 8 is a schematic cross-sectional view illustrating a pixel according to an embodiment. FIG. 7 illustrates a pixel structure based on the pixel circuit unit PXC described with reference to FIG. 3.

Referring to FIG. 7, the pixel PXL according to an embodiment may include the pixel circuit unit PXC and a gate driving circuit unit GDRA disposed in the display area DA.

The pixel circuit unit PXC may be positioned at a center portion of the display area DA, and the gate driving circuit unit GDRA may be positioned on an upper side and at both sides of the pixel circuit unit PXC. For example, the gate driving circuit unit GDRA may be positioned on the upper side of the pixel circuit unit PXC based on the first direction DR1, and may be positioned on left and right sides of the pixel circuit unit PXC based on the second direction DR2.

Although specific line and circuit elements of the gate driving circuit unit GDRA are not shown, a type and/or a size of the line may be variously modified according to a size and/or the number of circuit elements disposed in the gate driving circuit unit GDRA. Details of the gate driving circuit unit GDRA are described in detail with reference to FIG. 9 and a subsequent figure to be described later.

The pixel circuit unit PXC may include a first pixel circuit unit PXC1, a second pixel circuit unit PXC2, and a third pixel circuit unit PXC3 disposed in respective pixel areas SPXA1, SPXA2, and SPXA3.

The pixel circuit unit PXC may include a scan line SC, a data line DL, a sensing line SENL, a first power line PL1, a second power line PL2, a transistor M, and a storage capacitor Cst.

The scan line SC may extend in the second direction DR2 at an upper side of the first pixel area SPXA1.

The data line DL may extend in a first direction DR1 crossing or intersecting the scan line SC. The data line DL may include a first sub-data line D1, a second sub-data line D2, and a third sub-data line D3.

The sensing line SENL may extend in the first direction DR1 and may be positioned to be spaced apart from the data line DL.

The first power line PL1 may extend in the first direction DR1 and may be positioned to be spaced apart from the data line DL.

The second power line PL2 may extend in the second direction DR2 at a lower side of the third pixel area SPXA3. The second power line PL2 may be connected to an alignment electrode (not shown) of the light emitting unit EMU through second contact holes CH2.

Each pixel circuit unit PXC may include a first transistor M1, a second transistor M2, a third transistor M3, and a capacitor Cst disposed in each pixel area SPXA. For example, the first pixel circuit unit PXC1 may include a first transistor M1, a second transistor M2, a third transistor M3, and a capacitor Cst disposed in the first pixel area SPXA1. Similarly, the second pixel circuit unit PXC2 may include a first transistor M1, a second transistor M2, a third transistor M3, and a capacitor Cst disposed in the second pixel area SPXA2. The third pixel circuit unit PXC3 may include a first transistor M1, a second transistor M2, a third transistor M3, and a capacitor Cst disposed in the third pixel area SPXA3.

Each first transistor M1 may include a first semiconductor pattern SCP1, a first gate electrode GE1, a first source electrode SE1, and a first drain electrode DE1. Each first transistor M1 may further include a bottom metal layer BML overlapping the first gate electrode GE1.

The first semiconductor pattern SCP1 may overlap the first gate electrode GE1 and the bottom metal layer BML, and may be connected to the first source electrode SE1 and the first drain electrode DE1. For example, both ends of the first semiconductor pattern SCP1 may be connected to the first source electrode SE1 and the first drain electrode DE1 through respective contact holes (shown as X).

The first gate electrode GE1 may be connected to a lower electrode LE of the storage capacitor Cst and a second source electrode SE2. For example, the first gate electrode GE1 and the lower electrode LE of the storage capacitor Cst may be integrally connected with each other, and may be connected to the second source electrode SE2 through at least one contact hole (shown as X).

The first source electrode SE1 may be connected to an upper electrode UE of the storage capacitor Cst and a third source electrode SE3. For example, the first source electrode SE1 and the upper electrode UE of the storage capacitor Cst and the third source electrode SE3 may be integrally connected with each other. The first source electrode SE1 may be connected to the first electrode ELT1 (refer to FIG. 3) formed in the light emitting unit EMU of the pixel PXL through each first contact hole CH1. For example, the first source electrode SE1 of the first pixel circuit unit PXC1, the upper electrode UE of the storage capacitor Cst, and the third source electrode SE3 may be connected to a first alignment electrode (not shown) of the light emitting unit EMU through the first contact hole CH1 connecting the first pixel circuit unit PXC1 and the light emitting unit EMU (refer to FIG. 3), and may be connected to the first electrode ELT1 of the light emitting unit EMU through the first alignment electrode (not shown).

The first drain electrode DE1 may be connected to the first power line PL1 (refer to FIG. 3).

The bottom metal layer BML may overlap the first semiconductor pattern SCP1 and the first gate electrode GE1, and may be connected to the first source electrode SE1. For example, the bottom metal layer BML may be connected to the first source electrode SE1 through at least one contact hole (shown as X).

Each second transistor M2 may include a second semiconductor pattern SCP2, a second gate electrode GE2, the second source electrode SE2, and a second drain electrode DE2.

The second semiconductor pattern SCP2 may overlap the second gate electrode GE2 and may be connected to the second source electrode SE2 and the second drain electrode DE2. For example, both ends of the second semiconductor pattern SCP2 may be connected to the second source electrode SE2 and the second drain electrode DE2 through respective contact holes (shown as X).

The second gate electrode GE2 may be connected to the scan line SC. For example, the second gate electrode GE2 may be connected to each scan line SC through at least one contact hole (shown as X).

The second source electrode SE2 may be connected to the lower electrode LE of the storage capacitor Cst and the first gate electrode GE1. For example, the second source electrode SE2 may be connected to the lower electrode LE of the storage capacitor Cst and the first gate electrode GE1 through at least one contact hole (shown as X).

The second drain electrode DE2 may be connected to a corresponding sub-data line. For example, the second drain electrode DE2 of the first pixel circuit unit PXC1 may be connected to the first sub-data line D1 through at least one contact hole (shown as X), the second drain electrode DE2 of the second pixel circuit unit PXC2 may be connected to the second sub-data line D2 through at least one contact hole (shown as X), and the second drain electrode DE2 of the third pixel circuit unit PXC3 may be connected to the third sub-data line D3 through at least one contact hole (shown as X).

Each third transistors M3 may include a third semiconductor pattern SCP3, a third gate electrode GE3, a third source electrode SE3, and a third drain electrode DE3.

The third semiconductor pattern SCP3 may overlap the third gate electrode GE3 and may be connected to the third source electrode SE3 and the third drain electrode DE3. For example, both ends of the third semiconductor pattern SCP3 may be connected to the third source electrode SE3 and the third drain electrode DE3 through respective contact holes (shown as X).

The third gate electrode GE3 may be connected to each scan line SC or may be connected to a separate sensing control line SS (refer to FIG. 3) separated from the scan line SC. In an embodiment, the third gate electrode GE3 and the second gate electrode GE2 may be integrally connected with each other and may be connected to each scan line SC through at least one contact hole (shown as X).

The third source electrode SE3 may be connected to the upper electrode UE of the storage capacitor Cst and the first source electrode SE1. For example, the third source electrode SE3 and the upper electrode UE of the storage capacitor Cst and the first source electrode SE1 may be integrally connected with each other.

The third drain electrode DE3 may be connected to the sensing line SENL. For example, the third drain electrode DE3 may be connected to the sensing line SENL through at least one contact hole (shown as X).

The storage capacitor Cst may include the lower electrode LE and the upper electrode UE.

The lower electrode LE of the storage capacitor Cst may be connected to the first gate electrode GE1 and the second source electrode SE2. For example, the lower electrode LE of the storage capacitor Cst and the first gate electrode GE1 and the second source electrode SE2 may be integrally connected with each other.

The upper electrode UE of the storage capacitor Cst may be connected to the first source electrode SE1 and the third source electrode SE3. For example, the upper electrode UE of the storage capacitor Cst and the first source electrode SE1 and the third source electrode SE3 may be integrally connected with each other.

Referring to FIG. 8, the pixel PXL according to an embodiment may include a base layer BSL, and a pixel circuit layer PCL, a display layer DPL, a color filter layer CFL, and an encapsulation layer ENC disposed on the base layer BSL. Here, the pixel circuit layer PCL may include a structure corresponding to the pixel circuit unit PXC described with reference to FIG. 7.

The base layer BSL may be a rigid substrate or a flexible substrate. The base layer BSL may include a transparent or opaque insulating material, and may be a single-layer or multi-layer substrate or film.

The pixel circuit layer PCL may include circuit elements forming the pixel circuit unit PXC (refer to FIG. 3) of each pixel PXL and gate driving elements DRE forming the stages of the gate driving circuit GDR. The pixel circuit layer PCL may include pixel lines connected to the pixels PXL and driving lines connected to the driving elements DRE. The pixel circuit layer PCL may include insulating layers. For example, the pixel circuit layer PCL may include a buffer layer BFL, a gate insulating layer GI, an interlayer insulating layer ILD, and/or a passivation layer PSV sequentially disposed on one surface or a surface of the base layer BSL.

The bottom metal layer BML of the first transistors M1 may be positioned or disposed on the base layer BSL. The bottom metal layer BML may overlap the gate electrode GE and the semiconductor pattern SCP of the first transistor M1 to be described later.

The buffer layer BFL may be disposed on one surface or a surface of the base layer BSL to cover or overlap the base layer BSL and the bottom metal layer BML. The buffer layer BFL may prevent an impurity from diffusing into each circuit element.

The semiconductor layer may be disposed on the buffer layer BFL. The semiconductor layer may include a semiconductor pattern SCP of the first transistor M1 and a semiconductor pattern SCPd of the gate driving element DRE. Each of the semiconductor patterns SCP and SCPd may include a channel region overlapping gate electrodes GE and GEd of corresponding transistors M1 and DRE, and source and drain regions disposed on both sides of the channel region. Each of the semiconductor patterns SCP and SCPd may be a semiconductor pattern formed of polycrystalline silicon, amorphous silicon, an oxide semiconductor, or the like within the spirit and the scope of the disclosure.

The gate insulating layer GI may be disposed on the semiconductor layer to cover or overlap the semiconductor layer and the buffer layer BFL.

A second conductive layer may be disposed on the gate insulating layer GI. The second conductive layer may include the gate electrode GE of the first transistor M1 and the gate electrode GEd of the gate driving element DRE.

The interlayer insulating layer ILD may be disposed on the second conductive layer.

A third conductive layer may be disposed on the interlayer insulating layer ILD. The third conductive layer may include the source electrode SE and the drain electrode DE of the first transistor M1, and a source electrode SEd and a drain electrode DEd of the gate driving element DRE. Each of the source electrodes SE and SEd may be electrically connected to a source region of semiconductor patterns SCP and SCPd included in the corresponding transistors M1 and DRE, and each of the drain electrodes DE and DEd may be connected to a drain region of semiconductor patterns SCP and SCPd included in the corresponding transistors M1 and DRE.

The passivation layer PSV may be disposed on the third conductive layer. Each of the buffer layer BFL, the gate insulating layer GI, the interlayer insulating layer ILD, and the passivation layer PSV may be formed of a single layer or multiple layers, may include at least one inorganic insulating material and/or organic insulating material. For example, each of buffer layer BFL, the gate insulating layer GI, the interlayer insulating layer ILD, and the passivation layer PSV may include various types of organic or inorganic insulating materials including silicon nitride ($SiN_x$), silicon oxide ($SiO_x$), or silicon oxynitride ($SiO_xN_y$). In an embodiment, the passivation layer PSV may include an organic insulating layer and may planarize a surface of the pixel circuit layer PCL.

The display layer DPL may be disposed on the passivation layer PSV.

The display layer DPL may include first and second electrodes ELT1 and ELT2 disposed in an emission area EA of each pixel PXL, at least one light emitting element LD, and first and second contact electrodes CNE1 and CNE2. In an embodiment, each light emitting unit EMU may include light emitting elements LD including first and second light emitting elements LD1 and LD2.

The display layer DPL may include bank patterns BNP, a first insulating layer INS1, a first bank BNK1, a second insulating layer INS2, a third insulating layer INS3, a second bank BNK2, and a fourth insulating layer INS4. The display layer DPL may selectively further include a light conversion layer CCL including multiple elements QD/SCT.

The bank patterns BNP may be provided on the passivation layer PSV. The bank patterns BNP may be formed as separate patterns individually disposed under or below the first and second electrodes ELT1 and ELT2 to overlap a portion of each of the first and second electrodes ELT1 and ELT2.

The first and second electrodes ELT1 and ELT2 may protrude in an upper direction (for example, a third direction DR3) around the light emitting elements LD by the bank patterns BNP. The bank patterns BNP and the first and second electrodes ELT1 and ELT2 may form a reflective protrusion pattern around the light emitting elements LD.

The bank patterns BNP may include an inorganic insulating layer formed of an inorganic material or an organic insulating layer formed of an organic material. The bank patterns BNP may be formed of a single layer or multiple layers. The first and second electrodes ELT1 and ELT2 of the light emitting units EMU may be formed on the bank patterns BNP.

The first and second electrodes ELT1 and ELT2 may include at least one conductive material. For example, the first and second electrodes ELT1 and ELT2 may include at least one conductive material among at least one metal including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu) or an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO) and fluorine doped tin oxide (FTO), and a conductive polymer such as PEDOT, but are not limited thereto.

The first insulating layer INS1 may be disposed on the first and second electrodes ELT1 and ELT2. In an embodiment, the first insulating layer INS1 may include contact holes (not shown) for connecting the first and second electrodes ELT1 and ELT2 to the first and second contact electrodes CNE1 and CNE2, respectively.

The first insulating layer INS1 may be formed of a single layer or multiple layers, and may include at least one inorganic insulating material and/or organic insulating material. In an embodiment, the first insulating layer INS1 may include at least one type of inorganic insulating material including silicon nitride ($SiN_x$), silicon oxide ($SiO_x$), or silicon oxynitride ($SiO_xN_y$).

The first bank BNK1 may be disposed on the display area DA in which the first and second electrodes ELT1 and ELT2 and the first insulating layer INS1 are formed. The first bank BNK1 may have an opening corresponding to the emission area EA, and may be formed in a non-emission area NEA to surround the emission area EA. Accordingly, each emission area EA to which the light emitting elements LD are to be supplied may be defined (or partitioned). In an embodiment, the first bank BNK1 may include a light blocking and/or reflective material including a black matrix material.

The light emitting elements LD may be supplied to the emission area EA surrounded by the first bank BNK1. The light emitting elements LD may be aligned between the first and second electrodes ELT1 and ELT2 by first and second alignment signals applied to each first electrode ELT1 and each second electrode ELT2.

The second insulating layer INS2 may be disposed on a portion of the light emitting elements LD. For example, the second insulating layer INS2 may be locally disposed on a portion including a center portion of the light emitting elements LD to expose the first and second ends EP1 and EP2 of the light emitting elements LD aligned in the emission area EA.

The second insulating layer INS2 may be formed of a single layer or multiple layers, and may include at least one inorganic insulating material and/or organic insulating material. For example, the second insulating layer INS2 may include various types of organic or inorganic insulating materials including silicon nitride ($SiN_x$), silicon oxide ($SiO_x$), silicon oxynitride ($SiO_xN_y$), aluminum oxide ($Al_xO_y$), a photoresist (PR) material, and the like within the spirit and the scope of the disclosure.

Different electrodes among the first contact electrode CNE1, the second contact electrode CNE2, and an intermediate electrode IET may be formed on the both ends, for example, the first and second ends EP1 and EP2 of the light emitting elements LD which are not covered or overlapped by the second insulating layer INS2. For example, the first contact electrode CNE1 may be disposed on the first end EP1 of the first light emitting element LD1, and the intermediate electrode IET may be disposed on the second end EP2 of the first light emitting element LD1. The intermediate electrode IET may be disposed on the first end EP1 of the second light emitting element LD2, and the second contact electrode CNE2 may be disposed on the second end EP2 of the second light emitting element LD2.

Hereinafter, a stage and a stage block of a display panel according to an embodiment are described with reference to FIGS. 9 to 12.

Figure 9:
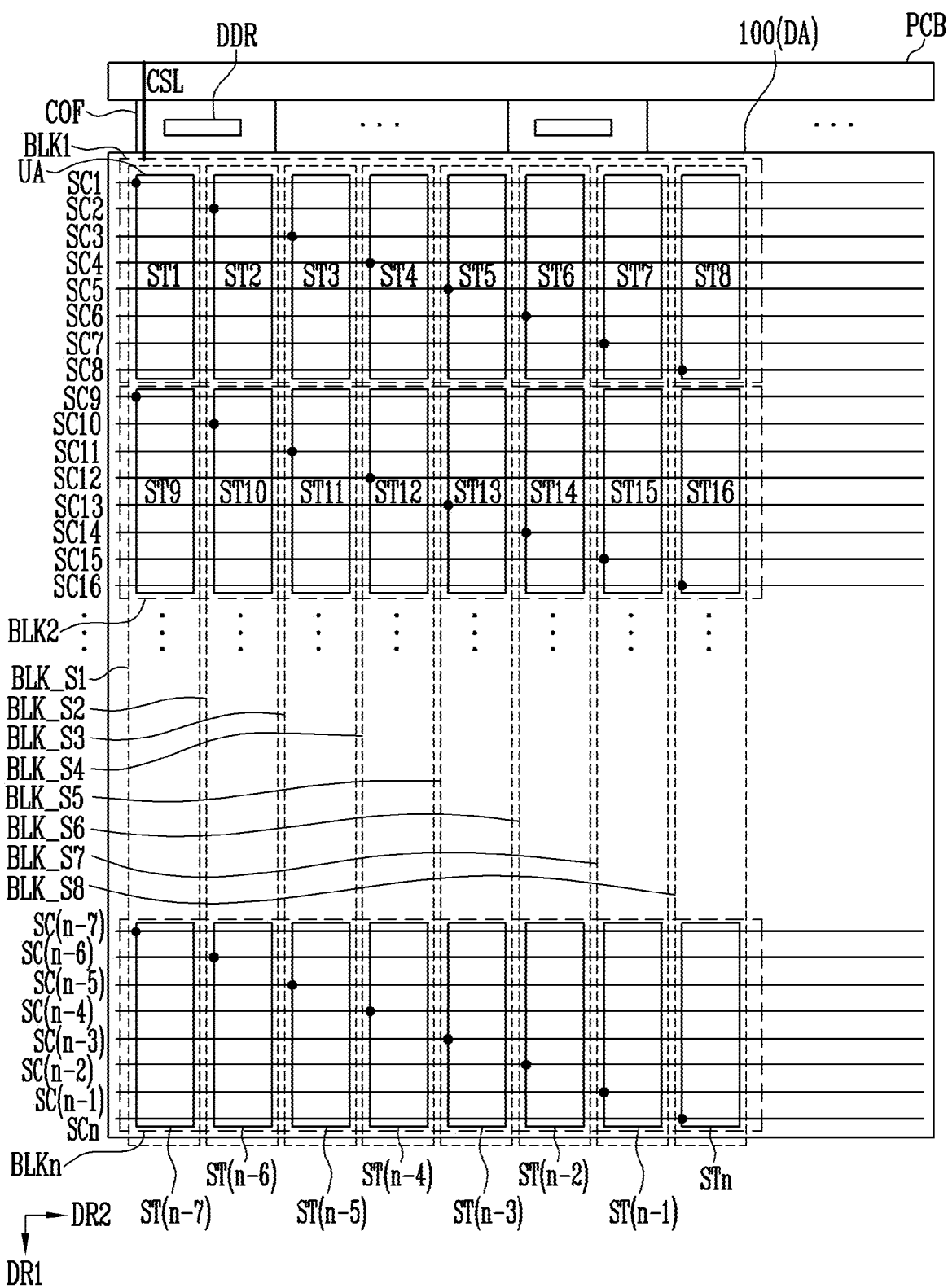
FIG. 9 is a schematic plan view illustrating an example of the display panel of FIG. 1.

FIG. 9 is a schematic plan view illustrating an example of the display panel of FIG. 1.

Figure 10:
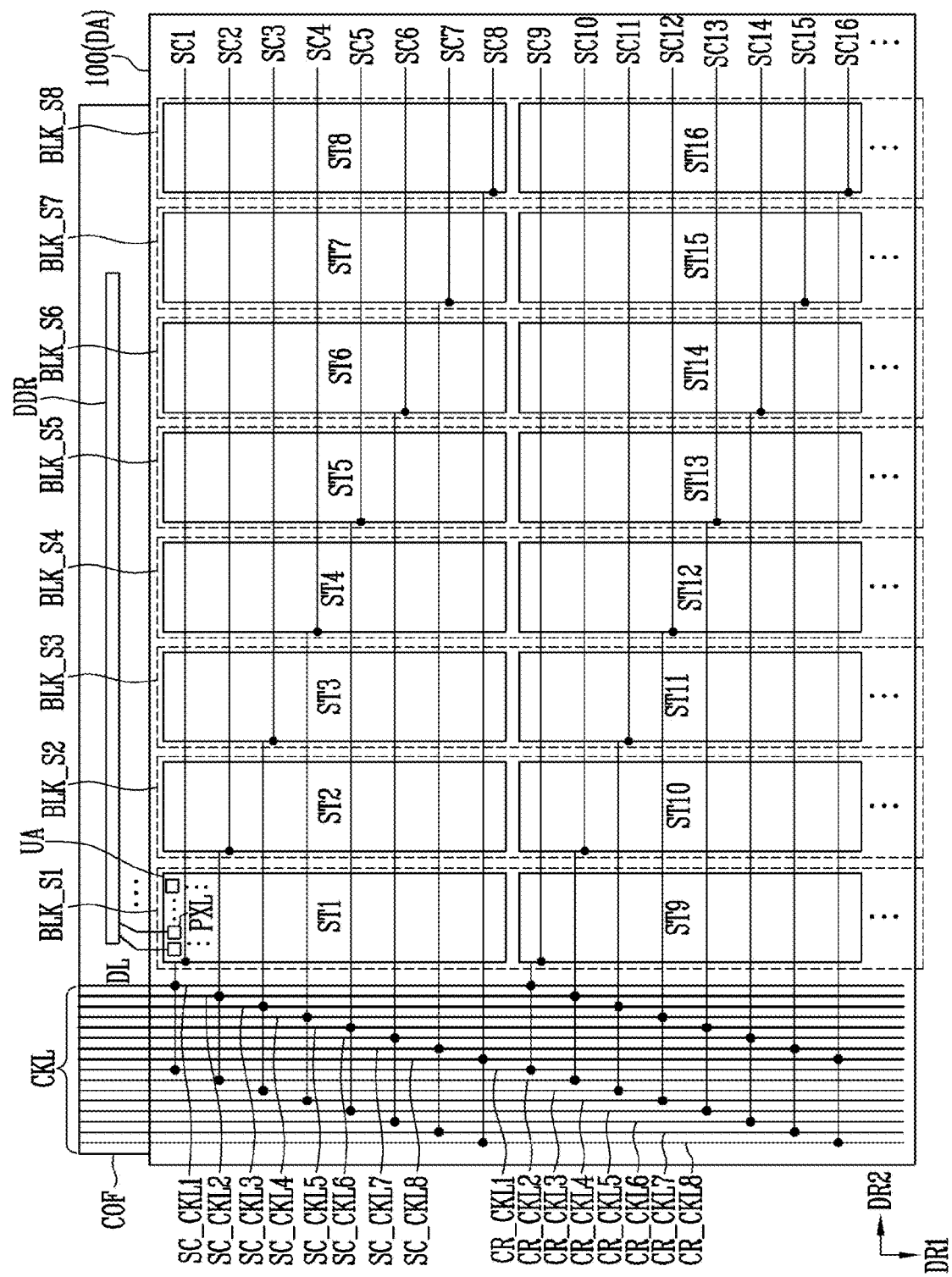
FIG. 10 is a schematic diagram illustrating an example of a unit area included in the display panel of FIG. 9.
Figure 11:
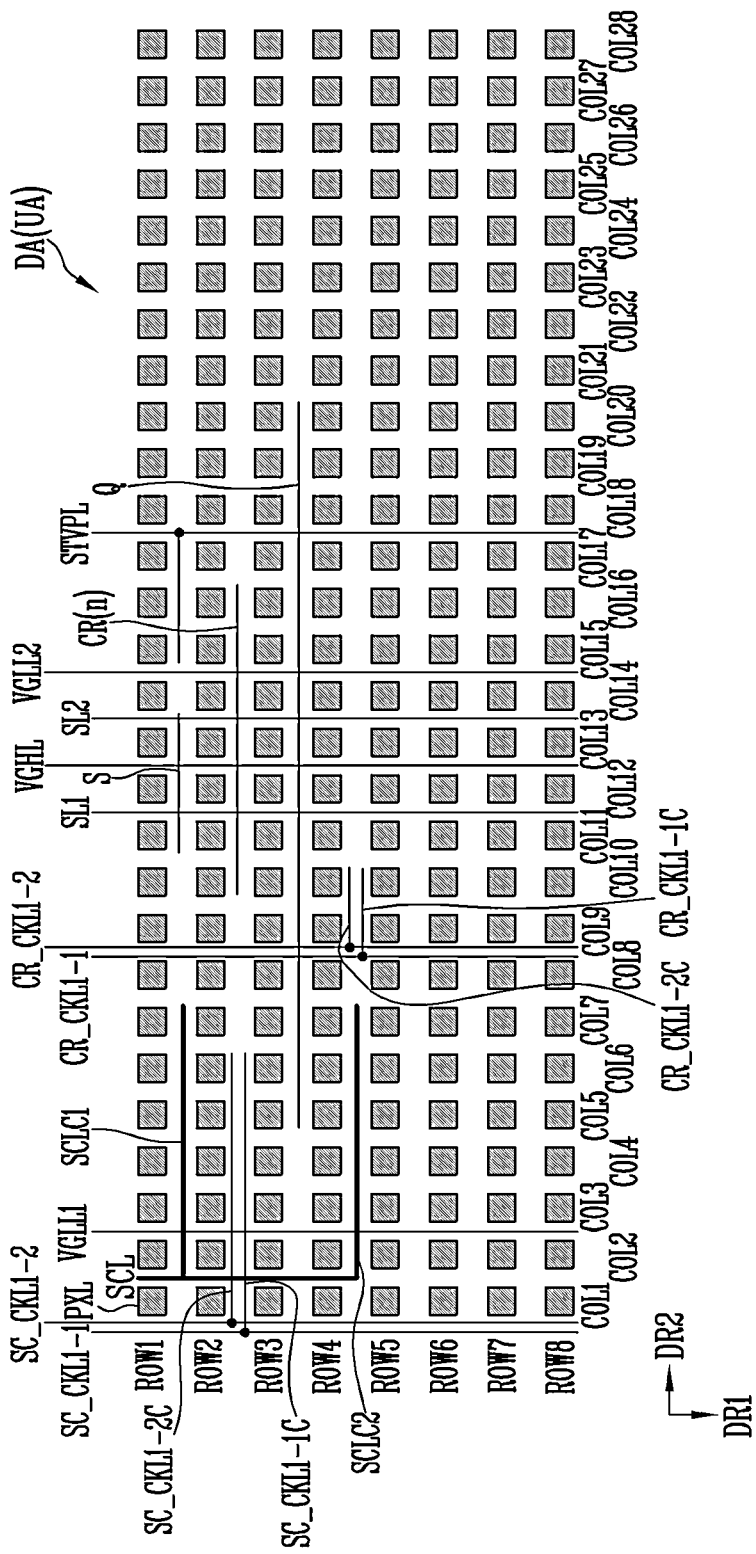
FIG. 11 is a schematic diagram illustrating an example of clock lines, control lines, and an output scan line included in the display panel of FIG. 8.
Figure 12:
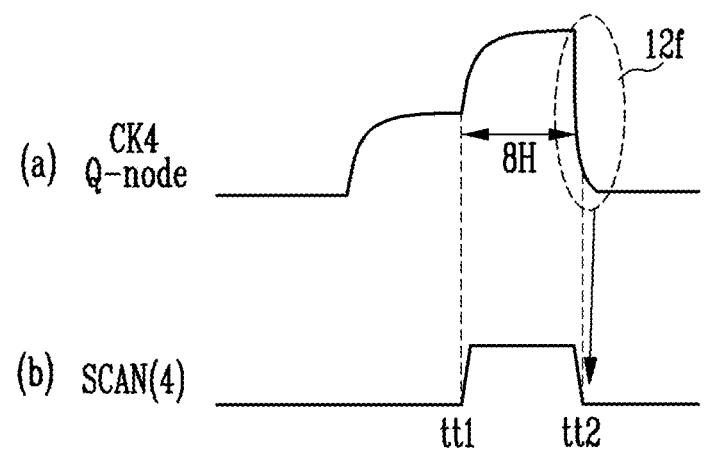
FIG. 12 is a graph illustrating a voltage change of a first node corresponding to a scan signal according to a comparative example.

FIG. 10 is a schematic diagram illustrating an example of a unit area included in the display panel of FIG. 9, FIG. 11 is a schematic diagram illustrating an example of clock lines, control lines, and an output scan line included in the display panel of FIG. 8, and FIG. 12 is a graph illustrating a voltage change of a first node corresponding to a scan signal according to a comparative example.

Referring to FIG. 9, the display device according to an embodiment may include a display panel 100, a connection film COF, and a circuit board PCB. Since the display device shown in FIG. 9 is similar to the display device of FIG. 1, a repetitive description is omitted, and the disclosure is described based on a difference.

The display panel 100 may receive clock signals and control signals from the outside (for example, a timing controller TCON (refer to FIG. 1) and a power supply) through a printed circuit board PCB and the connection film COF.

The control lines CSL may be disposed adjacent to a short side of the connection film COF. The control lines CSL may connect the display panel 100 from the printed circuit board PCB, and thus the control signals may be provided through the control lines CSL.

The display panel 100 may include the gate driving circuit GDR (refer to FIG. 1) dispersedly disposed in the display area DA.

The gate driving circuit GDR may include stage blocks BLK1, BLK2 to BLKn (or sub-stage blocks). The stage blocks BLK1, BLK2 to BLKn may include a first stage block BLK1 and a second stage block BLK2.

Each of the stage blocks BLK1 and BLK2 to BLKn may include stages ST1 to STn. For example, a first stage block BLK1 may include first to eighth stages ST1 to ST8, a second stage block BLK2 may include ninth to sixteenth stages ST9 to ST16, and an n-th stage block BLKn may include (n−7)-th to n-th stages ST(n−7) to STn. For example, one stage block among the stage blocks BLK1 and BLK2 to BLKn may include eight stages adjacent to each other in one direction or a direction (for example, the second direction DR2). In an embodiment, each of the stage blocks BLK1 and BLK2 to BLKn may include eight stages, but the disclosure is not limited thereto. According to an embodiment, each of the stage blocks BLK1 and BLK2 to BLKn may include various numbers of stages such as 4, 6, or 10 stages.

Each of the stages ST1 to STn may be dispersedly disposed in a unit area (for example, a unit area where pixel rows and pixel columns intersect) across which scan lines SC1 to SCn are disposed. For example, the first stage ST1 may be disposed in a unit area across which first to eighth scan lines SC1 to SC8 are disposed. For example, the stages ST1 to STn may be disposed in a unit area corresponding to each of the eight scan lines. However, this is an example, and each of the stages ST1 to STn may be disposed in a unit area corresponding to two, four, or five or more scan lines in consideration of the number, capacity, and the like of transistors and capacitors forming the stages ST1 to STn.

The stages ST1 to STn may be divided into sub-blocks BLK_S1 to BLK_S8 and may be disposed in areas separated from each other. For example, the stages ST1 to STn may be divided into first to eighth sub-blocks BLK_S1 to BLK_S8.

The stages ST1 to STn may be divided by clock lines (for example, carry clock lines or scan clock lines), and may be divided into the eight sub-blocks BLK_S1 to BLK_S8 based on the eight clock lines CKL1 to CKL8 described with reference to FIG. 5. However, this is an example, and the stages ST1 to STn may be divided into four sub-blocks or two sub-blocks.

A first sub-block BLK_S1 may include a first stage ST1, a fifth stage ST5, and an (n−7)-th stage ST(n−7). For example, the first sub-block BLK_S1 may include stages connected to the first clock lines CKL1 described with reference to FIG. 5.

The stages ST1 and ST9 to ST(n−7) of the first sub-block BLK_S1 may be disposed to be spaced apart from each other. For example, the first stage ST1 and the ninth stage ST9 may be disposed to be spaced apart from each other with a space in which at least one line may extend in the first direction DR1 between the first stage ST1 and the ninth stage ST9.

In case that the stages ST1 to STn are divided into the first to eighth sub-blocks BLK_S1 to BLK_S8, the clock lines CKL1 to CKL8 described with reference to FIG. 5 may be dispersedly disposed to be adjacent to a corresponding sub-block, and interference (for example, a capacitance due to overlap) between the clock lines CKL1 to CKL8 may be reduced. By way of example, as the stages ST1 to STn are sufficiently spaced apart from each other in the first direction DR1 in the corresponding sub-block, a space in which connection lines (for example, connection lines extending in the second direction DR2) for the clock lines CLK1 to CLK8 (and the control lines CSL) are disposed may be secured.

Since each of the first to eighth sub-blocks BLK_S1 to BLK_S8 may include only stages having a relationship sharing a carry signal (for example, providing a previous carry signal or a subsequent carry signal), a carry signal transmitting a carry signal may be removed between the first to eighth sub-blocks BLK_S1 to BLK_S8, and a parasitic capacitance of the carry signal line may also be reduced.

In FIG. 9, the first to eighth stages ST1 to ST8 may be disposed in the same row, but the disclosure is not limited thereto. For example, the first to eighth stages ST1 to ST8 may be alternately disposed along the second direction DR2.

In FIG. 10, the display panel 100 is schematically shown based on the clock lines CKL.

Referring to FIGS. 9 and 10, the clock lines CKL may include first to eighth scan clock lines SC_CKL1 to SC_CKL8 and first to eighth carry clock lines CR_CKL1 to CR_CKL8. First to eighth scan clock signals SC_CK1 to SC_CK8 may be applied to the first to eighth scan clock lines SC_CKL1 to SC_CKL8, respectively, and first to eighth carry clock signals CR_CK1 to CR_CK8 may be applied the first to eighth carry clock lines CR_CKL1 to CR_CKL8, respectively.

The clock lines CKL may extend to the connection film COF or may be connected to transmission lines on the connection film COF, and receive clock signals from the outside (for example, the timing controller TCON (refer to FIG. 1) through the circuit board PCB).

The clock lines CKL may extend in the first direction DR1 in the display area DA and may be electrically connected to corresponding stages among the stages ST1 to STn, respectively. For example, the first to eighth clock lines SC_CKL1 to SC_CKL8 and CR_CKL1 to CR_CKL8 may be electrically connected to the first to eighth stages ST1 to ST8 positioned in the first stage block BLK1, and may be electrically connected to the ninth to sixteenth stages ST9 to ST16 positioned in the second stage block BLK2. According to an embodiment, the number of stages corresponding to the clock lines may be variously modified.

The stages ST1 to STn may be electrically connected to scan lines SC1 to SC16 and the like extending in the second direction DR2 in the display area DA. For example, the first to eighth stages ST1 to ST8 disposed in the first stage block BLK1 may be electrically connected to the first to eighth scan lines SC1 to SC8, and the ninth to sixteenth stages ST9 to ST16 disposed in the second stage block BLK2 may be electrically connected to the ninth to sixteenth scan lines SC9 to SC16. Accordingly, a scan signal output from the first to eighth stages ST1 to ST8 may be output through scan lines. In an embodiment, in order to prevent a stain of the display panel, a scan signal output from one stage block among the stage blocks may be supplied to scan lines of another stage block. Details are described with reference to FIG. 12 below.

The scan clock lines SC_CKL1 to SC_CKL8 and the carry clock lines CR_CKL1 to CR_CKL8 may be disposed adjacent to one side or a side of the display area DA. For example, the scan clock lines SC_CKL1 to SC_CKL8 and the carry clock lines CR_CKL1 to CR_CKL8 may be positioned on a left side of the display area DA in the second direction DR2. In FIG. 10, the scan clock lines SC_CKL1 to SC_CKL8 may be disposed closer to the gate driving circuit GDR than the carry clock lines CR_CKL1 to CR_CKL8, but the disclosure is not limited thereto. According to an embodiment, the carry clock lines CR_CKL1 to CR_CKL8 may be disposed closer to the gate driving circuit GDR than the scan clock lines SC_CKL1 to SC_CKL8.

FIG. 11 illustrates pixels PXL arranged or disposed along pixel rows ROW and pixel columns COL of a unit area UA. For example, the unit area UA may correspond to an area where first to eighth pixel rows ROW1 to ROW8 and first to twenty-eighth pixel columns COL1 to COL28 intersect.

One stage STn (n is a natural number) described with reference to FIGS. 9 and 10 may correspond to the unit area UA of FIG. 11. The unit area UA of FIG. 11 may correspond to a partial area of the display area DA, and the display area DA may correspond to the display area DA described with reference to FIG. 1 or the like within the spirit and the scope of the disclosure.

Referring to FIGS. 5, 6, 10, and 11, clock lines SC_CKL1-1, SC-CKL1-2, CR_CKL1-2, and CR_CKL1-2, a start signal line STVPL, control lines SL1, SL2, VGLL1, VGLL2, and VGHL, and output scan lines SCL, SCLC1 and SCLC2 may be disposed in the unit area UA according to an embodiment.

A gate driving element (not shown) forming the gate driving circuit GDR (or the stage) may be positioned between the pixels PXL disposed in the unit area UA. At least one of the clock lines SC_CKL1-1, SC-CKL1-2, CR_CKL1-2, and CR_CKL1-2, the start signal line STVPL, the control lines SL1, SL2, VGLL1, VGLL2, and VGHL, and the output scan lines SCL, SCLC1, and SCLC2 may be electrically connected to the gate driving element. Accordingly, a clock signal and a control signal may be applied to the gate driving element, through the clock lines SC_CKL1-1, SC-CKL1-2, CR_CKL1-2, and CR_CKL1-2, the start signal line STVPL, and the control lines SL1, SL2, VGLL1, VGLL2, and VGHL, and the gate driving element may generate a scan signal in response to the clock signal and/or the control signal. The generated scan signal may be supplied to a scan line connected to another stage through the output scan lines SCL, SCLC1, and SCLC2.

The clock lines CKL may include scan clock lines SC_CKL1-1 and SC_CKL1-2 and carry clock lines CR_CKL1-1 and CR_CKL1-2.

The scan clock lines SC_CKL1-1 and SC_CKL1-2 may extend in the first direction DR1 and may be positioned at one side or a side of a first pixel column COL1 in the second direction DR2. The scan clock lines SC_CKL1-1 and SC_CKL1-2 may include a first sub-scan clock line SC_CKL1-1 and a second sub-scan clock line SC_CKL1-2. The first sub-scan clock line SC_CKL1-1 may be positioned between a second pixel row ROW2 and a third pixel row ROW3 in the first direction DR1, and may be electrically connected to a first scan connection line SC_CKL1-1C positioned between a first pixel column COL1 to a sixth pixel column COL6 in the second direction DR2. The second sub-scan clock line SC_CKL1-1 may be electrically connected to a second scan connection line SC_CKL1-2C positioned adjacent to and spaced apart from the first scan connection line SC_CKL1-1C.

A first scan clock signal may be applied to the first sub-scan clock line SC_CKL1-1, and a first inversion scan clock signal may be applied to the second sub-scan clock line SC_CKL1-2. Here, the first scan clock signal may correspond to the scan clock signal SC_CK described with reference to FIG. 5, and the first inversion scan clock signal may correspond to the inversion scan clock signal SC_CKB described with reference to FIG. 5. Accordingly, each of the scan clock signal SC_CK and the inversion scan clock signal SC_CKB may be supplied to the gate driving element positioned adjacent to the first scan connection line SC_CKL1-1C and the second scan connection line SC_CKL1-2C.

Carry clock lines CR_CKL1 and CR_CKL2 may extend in the first direction DR1 and may be positioned between an eighth pixel column COL8 and a ninth pixel column COL9 in the second direction DR2. The carry clock lines CR_CKL1 and CR_CKL2 may include a first sub-carry clock line and a second sub-carry clock line.

The start signal line STVPL may extend in the first direction DR1 and may be positioned between a seventeenth pixel column COL17 and an eighteenth pixel column COL18 in the second direction DR2. The start pulse STVP described with reference to FIG. 6 may be supplied to the gate driving element of the unit area UA through the start signal line STVPL.

An n-th carry line CR(n) may be positioned between the second pixel row ROW2 and a third pixel row ROW3 in the first direction DR1, and may be positioned between a tenth pixel column COL10 to a sixteenth pixel column COL16 in the second direction DR2. The i-th carry signal CRi described with reference to FIG. 6 may be output through the n-th carry line CR(n).

The control lines CSL may include a first gate low voltage line VGLL1, a second gate low voltage line VGLL2, a gate high voltage line VGHL, a first control signal line SL1, and a second control signal line SL2.

The first gate low voltage line VGLL1 may extend in the first direction DR1 and may be positioned between a second pixel column COL2 and a third pixel column COL3 in the second direction DR2. The first gate low voltage VGL1 described with reference to FIG. 6 may be supplied to the gate driving element of the unit area UA through the first gate low voltage line VGLL1.

The second gate low voltage line VGLL2 may extend in the first direction DR1 and may be positioned between a fourteenth pixel column COL14 and a fifteenth pixel column COL15 in the second direction DR2. The second gate low voltage VGL2 described with reference to FIG. 6 may be supplied to the gate driving element of the unit area UA through the second gate low voltage line VGLL2.

The gate high voltage line VGHL may extend in the first direction DR1 and may be positioned between a twelfth pixel column COL12 and a thirteenth pixel column COL13 in the second direction DR2. The gate high voltage VGH described with reference to FIG. 6 may be supplied to the gate driving element of the unit area UA through the gate high voltage line VGHL.

The first control signal line SL1 may extend in the first direction DR1 and may be positioned between an eleventh pixel column COL11 and a twelfth pixel column COL12 in the second direction DR2. The first control signal S1 described with reference to FIG. 6 may be supplied to the gate driving element of the unit area UA through the first control signal line SL1.

The second control signal line SL2 may extend in the first direction DR1 and may be positioned between a thirteenth pixel column COL13 and a fourteenth pixel column COL14 in the second direction DR2. The second control signal S2 described with reference to FIG. 6 may be supplied to the gate driving element of the unit area UA through the second control signal line SL2.

The output scan lines SCL may include horizontal scan lines SCLC1 and SCLC2 and an output scan line SCL. The horizontal scan lines SCLC1 and SCLC2 and the output scan line SCL may be electrically connected.

The horizontal scan lines SCLC1 and SCLC2 may include a first horizontal scan line SCLC1 and a second horizontal scan line SCLC2.

The first horizontal scan line SCLC1 may be positioned between the first pixel row ROW1 and the second pixel row ROW2 in the first direction DR1, and may be positioned between the first pixel column COL1 and the eighth pixel column COL8 in the second direction DR2.

A vertical scan line SCL may be positioned between the first pixel row ROW and a fourth pixel row ROW4 in the first direction DR1, and may be positioned between the first pixel column COL1 and the second pixel column COL2 in the second direction DR2.

In the first horizontal scan line SCLC1, the gate driving element described with reference to FIG. 6 (for example, the first transistor T1 (refer to FIG. 6)) may be disposed adjacent to the first horizontal scan line SCLC1, and the first horizontal scan line SCLC1 may be connected to the gate driving element. The scan signal SCANi generated by the first transistor T1 (refer to FIG. 6) may be output through the first horizontal scan line SCLC1 and the vertical scan line SCL. The vertical scan line SCL may be electrically connected to the first scan line SC1 through a conductor (not shown). Accordingly, the scan signal may be applied to the pixels PXL disposed in the first pixel row ROW through the first scan line SC1.

The first node Q may be formed between the third pixel row ROW3 and the fourth pixel row ROW4 in the first direction DR1 and between a fifth pixel column COL5 to a twentieth pixel column COL20 in the second direction DR2.

The second node S may be formed between the first pixel row ROW1 and the second pixel row ROW2 in the first direction DR1 and between a tenth pixel column COL10 and a fourteenth pixel column COL14 in the direction DR2 by the gate driving elements disposed between the pixels PXL.

Referring to FIG. 6, since the first transistor T1 may output the scan signal SCANi in response to the first node Q, the voltage change of the first node Q may affect light emission of the pixels PXL according to a position of the pixel row outputting the scan signal SCANi.

Referring to FIG. 12, in (a), the voltage of the first node Q (or a Q-node) changed in response to a fourth clock signal CK4 is shown, and in (b), a fourth scan signal output through a fourth scan line is shown.

In a fourth stage ST4 connected to the fourth clock line CKL4, the fourth scan signal SCAN(4) corresponding to the fourth clock signal CK4 may be output.

At this time, the voltage of the first node Q (or the Q-node) may be changed in response to the fourth clock signal CK4 as shown in (a), and the fourth scan signal SCAN(4) corresponding to the fourth clock signal CK4 may be changed as shown in (b). The fourth scan signal SCAN(4) may have a high-level voltage from a first time point tt1 to a second time point tt2, and may have a low-level voltage after the second time point tt2. Accordingly, a voltage of the fourth scan line may be in a floating state after the second time point tt2. Here, a period from the first time point tt1 to the second time point tt2 may correspond to an eighth horizontal period 8H. In a graph of (a), since a voltage of the first node Q-node is in a falling state 12f after the second time point tt2, the voltage of the fourth scan line that was in the floating state may be affected by the voltage of the first node Q-node. Since the voltage of the fourth scan line may be in a falling state like the voltage of the first node Q-node, a light emission defect may occur in fourth pixel rows connected to the fourth scan line due to a scan voltage that is not maintained constant. For example, in the display panel, a stain may occur due to the light emission defect of the fourth pixel rows.

Referring to FIG. 11, since third pixel rows connected to a third scan line may also be positioned adjacent to the first node Q, a voltage of the third scan line may also be affected by the voltage of the first node Q. Accordingly, a stain may occur in the display panel due to a light emission defect of the third pixel rows.

Since the display device according to an embodiment applies an n-th scan signal output from a stage block (or a unit area) positioned at a lower side in the first direction DR1 to a stage block (or a unit area) positioned at an upper side in the first direction DR1, the display device according to an embodiment may reduce an effect of the voltage change of the first node Q on the pixels PXL. Accordingly, the stain of the display panel may be improved.

Hereinafter, how an output scan signal is applied to each unit area in a display device according to an embodiment is described with reference to FIGS. 13 to 17.

Figure 13:
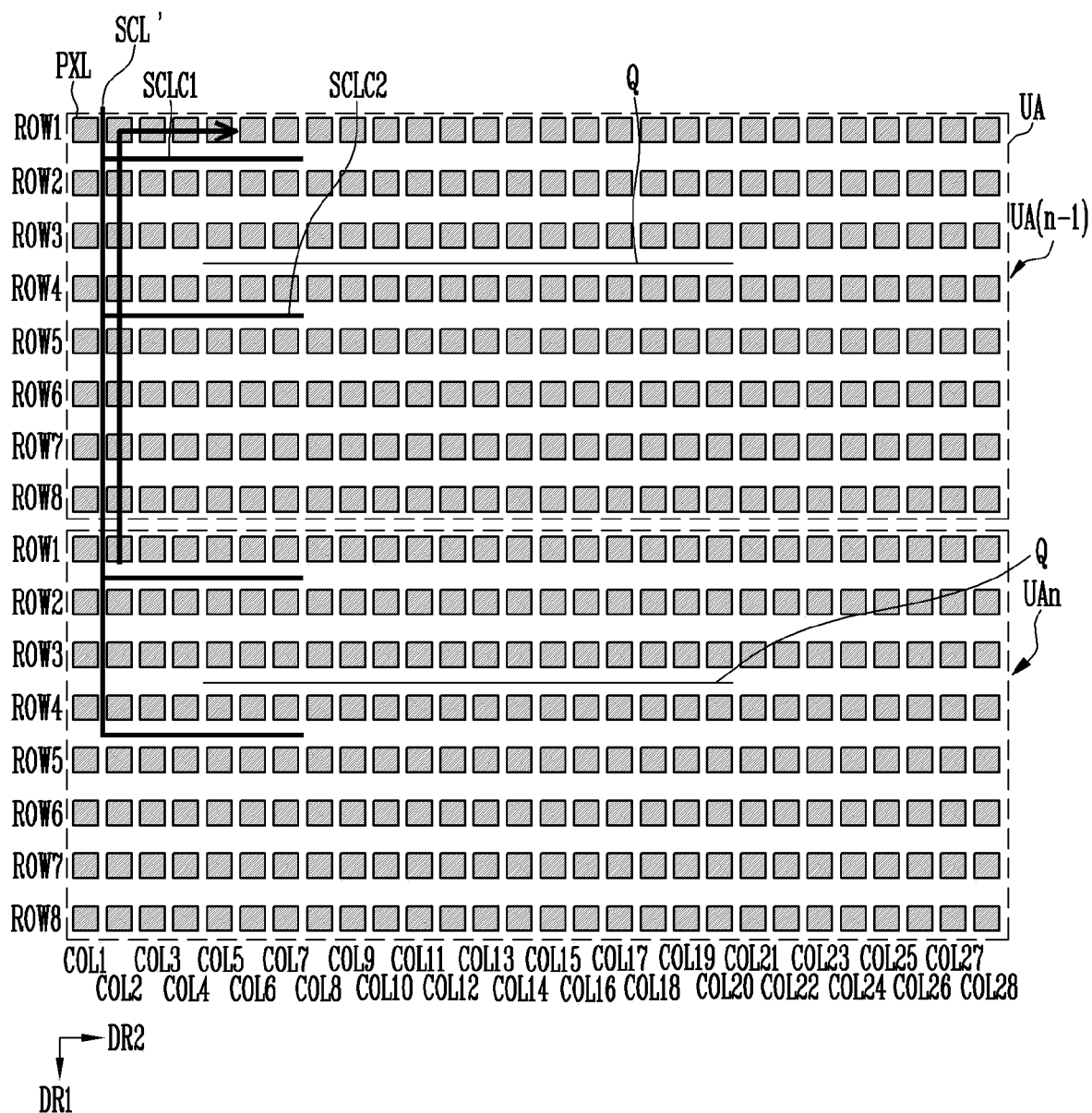
FIG. 13 is a schematic diagram illustrating unit areas included in a display panel according to an embodiment.
Figure 14:
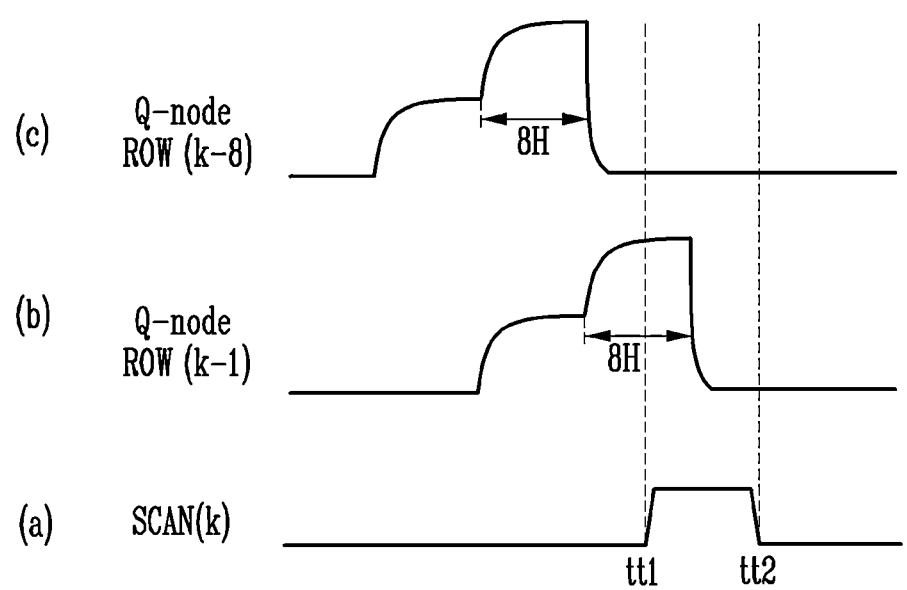
FIG. 14 is a graph illustrating a voltage change of a first node corresponding to a scan signal according to an embodiment.
Figure 15:
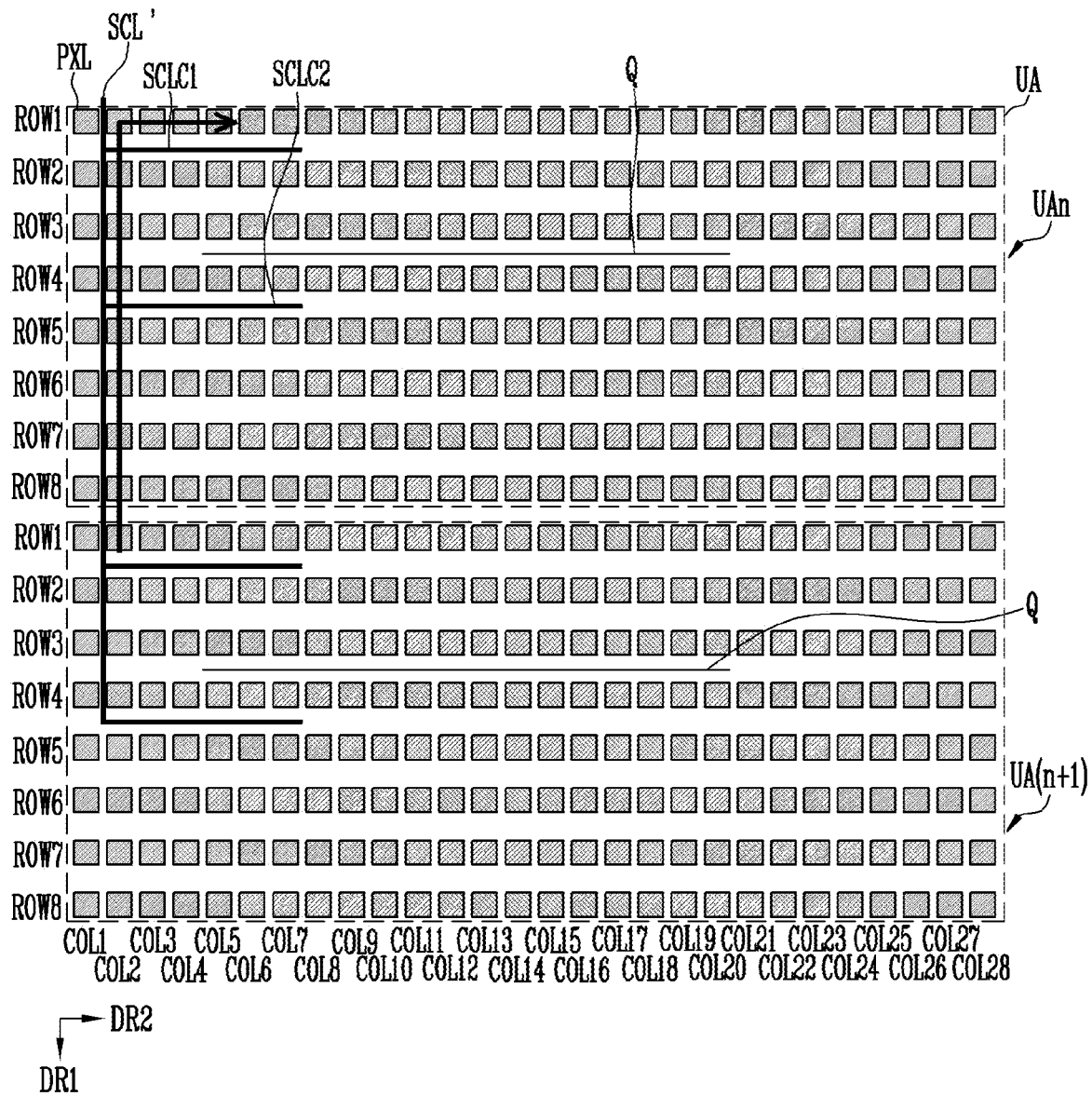
FIG. 15 is a schematic diagram illustrating unit areas included in a display panel according to an embodiment.
Figure 16:
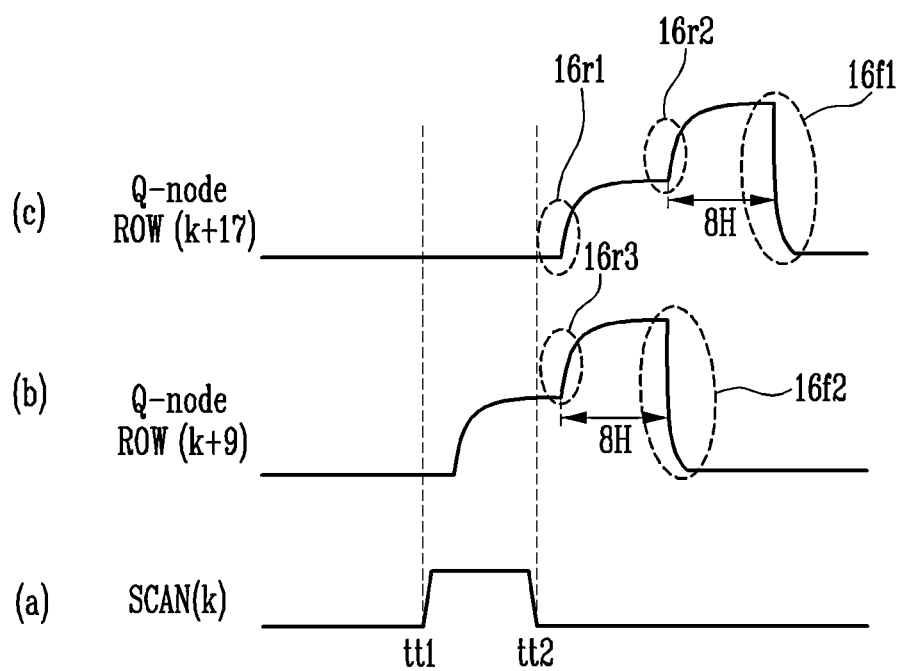
FIG. 16 is a graph illustrating a voltage change of a first node corresponding to a scan signal according to an embodiment.

FIG. 13 is a schematic diagram illustrating unit areas included in a display panel according to an embodiment, FIG. 14 is a graph illustrating a voltage change of a first node corresponding to a scan signal according to an embodiment, and FIG. 15 is a schematic diagram illustrating unit areas included in a display panel according to an embodiment. FIG. 16 is a graph illustrating a voltage change of a first node corresponding to a scan signal according to an embodiment, and FIG. 17 is a schematic diagram illustrating unit areas included in a display panel according to an embodiment.

The unit area shown in FIGS. 13, 15, and 17 may correspond to one stage described with reference to FIGS. 4, 9, and 10, and may correspond to stage blocks including stages. The unit area is shown based on the line for the pixels PXL and the gate driving circuit. As described with reference to FIG. 4, the stages ST may be dispersedly disposed in the display area DA, and thus stage blocks may be divided in correspondence with the unit area.

Figure 17:
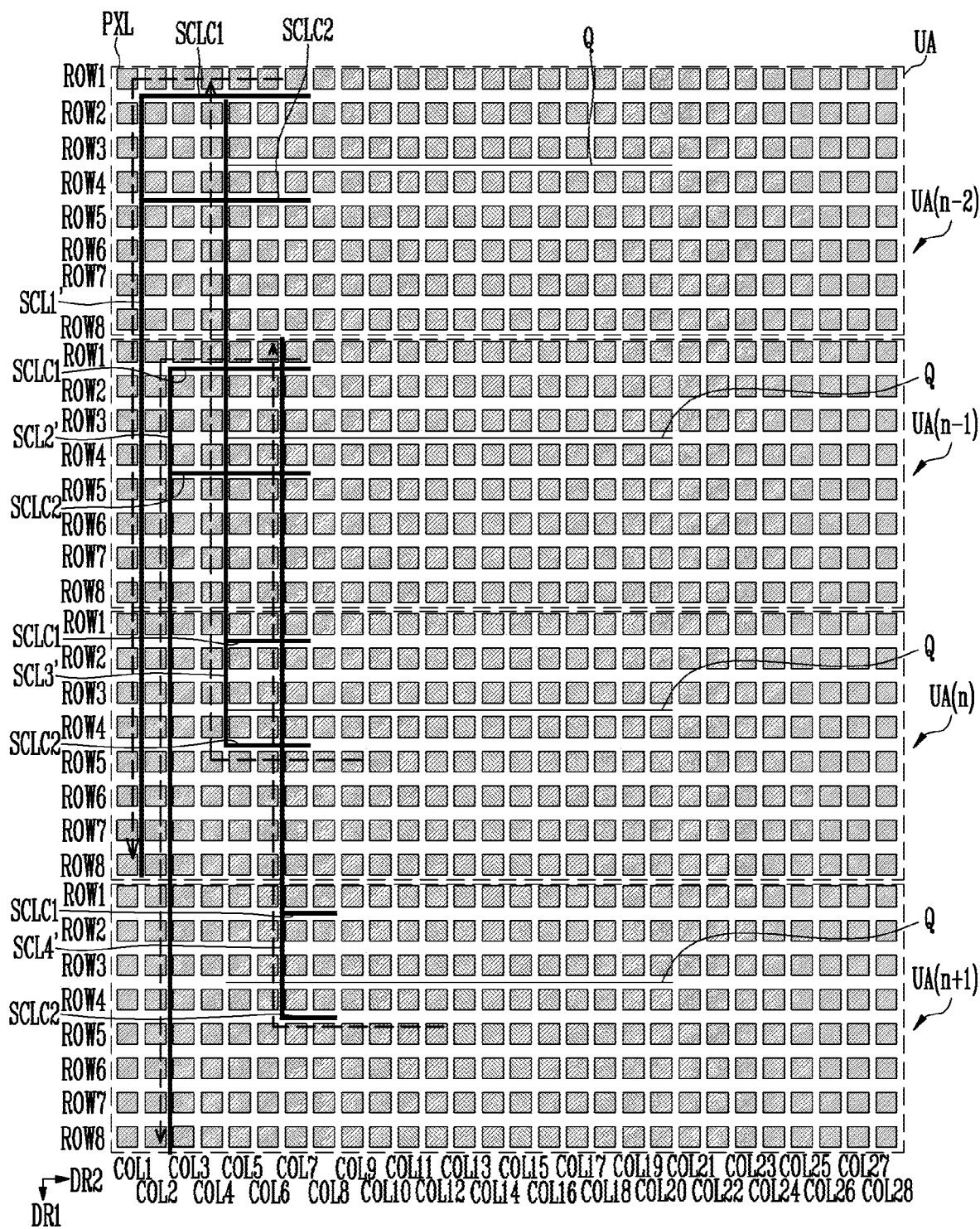
FIG. 17 is a schematic diagram illustrating unit areas included in a display panel according to an embodiment.

FIG. 13 shows an (n−1)-th unit area UA (n−1) and an n-th unit area UAn, FIG. 15 shows the n-th unit area UAn and an (n+1)-th unit area UA(n+1), and FIG. 17 shows an (n−2)-th unit area UA(n−2), the (n−1)-th unit area UA(n−1), the n-th unit area UAn, and the (n+1)-th unit area UA(n+1). The (n−2)-th unit area UA(n−2), the (n−1)-th unit area UA(n−1), the n-th unit area UAn, and the (n+1)-th unit area UA(n+1) may be areas disposed adjacent to each other in the first direction DR1 in the display panel 100 (refer to FIG. 1). Since the unit areas shown in FIGS. 13, 15, and 17 are similar to the unit areas shown in FIG. 11, the disclosure is described based on a difference. An output scan line disposed in the unit areas shown in FIGS. 13, 15, and 17 is different from the output scan line shown in FIG. 11.

Referring to FIG. 13, an output scan line SCL' (or a first output scan line) may be positioned over the n-th unit area UAn and the (n−1)-th unit area UA(n−1). For example, the vertical scan line SCL among the output scan lines SCL' may extend over the n-th unit area UAn and the (n−1)-th unit area UA(n−1) in the first direction DR1. Accordingly, an (n−1)-th scan signal output through the horizontal scan lines SCLC1 and SCLC2 in the (n−1)-th unit area UA(n−1) may be output to an n-th scan line of the n-th unit area UAn through the vertical scan line SCL. An output direction of the scan signal is shown as an arrow in FIG. 13. For example, the scan signal may be applied from a lower side to an upper side based on the first direction DR1.

For example, in case that the n-th unit area UAn is a sixty-fifth unit area, the sixty-fifth unit area may be electrically connected to a five hundred twenty-first scan line, and a sixty-fourth unit area which is the (n−1)-th unit area UA(n−1) may be electrically connected to a five hundred thirteenth scan line. The sixty-fifth unit area may be electrically connected to the first scan clock line SC_CKL1 (refer to FIG. 10) to output a sixty-fifth scan signal corresponding to the first scan clock signal. The sixty-fifth scan signal according to an embodiment may be applied to the vertical scan line SCL of the sixty-fourth unit area through the vertical scan line SCL, and the vertical scan line SCL of the sixty-fourth unit area may be electrically connected to the five hundred thirteenth scan line. Therefore, a scan signal corresponding to the sixty-fifth scan signal may be supplied to the five hundred thirteenth scan line of the sixty-fourth unit area. For example, in an embodiment, since the scan signal output from the n-th unit area (or stage block) is output to a scan line electrically connected to the (n−1)-th unit area, a voltage of the scan line of the n-th unit area (or stage block) may not be affected by the voltage change of the first node. Accordingly, a stain of the display panel may be improved.

Referring to FIG. 14, (a) shows a k-th scan signal SCAN (k) output from a k-th scan line, (b) shows the voltage change of the first node Q-node of a (k−1)-th pixel row ROW(k−1)th, and (c) shows the voltage change of the first node Q-node of a (k−8)-th pixel row ROW(k−8)th. Here, the k-th scan line may correspond to one scan line of the n-th unit area (or stage block), and the (k−1)-th pixel row ROW(k−1)th and the (k−8)-th pixel row ROW(k−8)th may correspond to the (n−1)-th unit area (or stage block). In a graph of (a), the k-th scan signal output from the k-th scan line may have a high-level voltage at the first time point tt1 to the second time point tt2, and may have a low-level voltage after the second time point tt2. Accordingly, a voltage of the k-th scan line may be in a floating state after the second time point tt2. Here, a period from the first time point tt1 to the second time point tt2 may correspond to an eighth horizontal period 8H, but the disclosure is not limited thereto.

In graphs of (b) and (c), since the voltage of the first node Q-node is in a falling state before the second time point tt2, the k-th scan line may not be affected by the voltage change of the first node Q-node. For example, since the voltage of the k-th scan line may have a high-level voltage regardless of the voltage of the first node Q-node, k-th pixel rows connected to the k-th scan line may stably emit light. Accordingly, a stain defect of the display panel may be improved.

Referring to FIG. 15, output scan line SCL', SCLC1, and SCLC2 (or second output scan lines) may be positioned over the n-th unit area UAn and the (n+1)-th unit area UA(n+1). For example, the vertical scan line SCL' among the output scan lines SCL', SCLC1, and SCLC2 may extend over the n-th unit area UAn and the (n+1)-th unit area UA(n+1) in the first direction DR1. Accordingly, an (n+1)-th scan signal output through the horizontal scan lines SCLC1 and SCLC2 in the (n+1)-th unit area UA(n+1) may be output to the n-th scan line of the n-th unit area UAn through the vertical scan line SCL'. An output direction of the scan signal is shown as an arrow in FIG. 15. For example, the scan signal may be applied from the lower side to the upper side based on the first direction DR1.

For example, in case that the n-th unit area UAn is the sixty-fifth unit area, the sixty-fifth unit area may be electrically connected to the five hundred twenty-first scan line, and a sixty-sixth unit area which is the (n+1)-th unit area UA(n+1) may be electrically connected to a five hundred twenty-ninth scan line. The sixty-sixth unit area may be electrically connected to the first scan clock line SC_CKL1 (refer to FIG. 10) to output a sixty-sixth scan signal corresponding to the first scan clock signal. The sixty-sixth scan signal according to an embodiment may be applied to the vertical scan line SCL' of the sixty-fifth unit area through the vertical scan line SCL', and the vertical scan line SCL' of the sixty-fifth unit area may be electrically connected to the five hundred twenty-first scan line. Therefore, a scan signal corresponding to the sixty-sixth scan signal may be supplied to the five hundred twenty-first scan line of the sixty-fifth unit area. For example, in an embodiment, since the scan signal output from the (n+1)-th unit area (or stage block) is output to a scan line electrically connected to the n-th unit area, a voltage of the scan line of the (n+1)-th unit area (or stage block) may not be affected by the voltage change of the first node. Accordingly, a stain of the display panel may be improved.

Referring to FIG. 16, (a) shows the k-th scan signal SCAN(k) output from the k-th scan line, (b) shows the voltage change of the first node Q-node of a (k+9)-th pixel row ROW(k+9)th, and (c) shows the voltage change of the first node Q-node of a (k+17)-th pixel row ROW(k+17)th. Here, the k-th scan line may correspond to one scan line of the n-th unit area (or stage block), and the (k+9)-th pixel row ROW(k+9)th and the (k+17)-th pixel row ROW(k+17)th may correspond to the (n+1)-th unit area (or stage block).

In a graph of (a), the k-th scan signal output from the k-th scan line may have a high-level voltage at the first time point tt1 to the second time point tt2, and may have a low-level voltage after the second time point tt2. Accordingly, the voltage of the k-th scan line may be in a floating state after the second time point tt2. Here, the period from the first time point tt1 to the second time point tt2 may correspond to the eighth horizontal period 8H, but the disclosure is not limited thereto.

In graphs of (b) and (c), since the voltage of the first node Q-node is in rising states 16r1, 16r2, and 16r3 and falling states 16f1 and 16f2 after the second time point tt2 and mutual voltage changes are cancelled, the k-th scan line may not be affected by the voltage change of the first node Q-node. For example, since the voltage of the k-th scan line may have a high-level voltage regardless of the voltage of the first node Q-node, the k-th pixel rows connected to the k-th scan line may stably emit light. Accordingly, a stain defect of the display panel may be improved.

Referring to FIG. 17, output scan lines SCL1', SCL2', SCL3', SCL4', SCLC1, and SCLC2 may be positioned over the (n−2)-th unit area UA(n−2), the (n−1)-th unit area UA(n−1), the n-th unit area UAn, and the (n+1)-th unit area UA(n+1).

Vertical scan lines SCL1', SCL2', SCL3', and SCL4' among the output scan lines SCL1', SCL2', SCL3', SCL4', SCLC1, and SCLC2 may extend over (n−2)-th unit area UA(n−2), the (n−1)-th unit area UA(n−1), the n-th unit area UAn, and the (n+1)-th unit area UA(n+1) in the first direction DR1. Accordingly, the scan signal output from each unit area may be applied to another unit area. An output direction of the scan signal is shown as a dotted arrow in FIG. 17.

The vertical scan lines SCL1', SCL2', SCL3', and SCL4' may include a first vertical scan line SCL1', a second vertical scan line SCL2', a third vertical scan line SCL3', and a fourth vertical scan lines SCL4'.

The first vertical scan line SCL1' (or a third output scan line) may extend in the first direction DR1 in the (n−2)-th unit area UA(n−2), the (n−1)-th unit area UA(n−1), and the n-th unit area UAn and may be positioned between the first pixel column COL1 and the second pixel column COL2 in the second direction DR2. The first vertical scan line SCL1' may be electrically connected to the horizontal scan lines SCLC1 and SCLC2 in the (n−2)-th unit area UA(n−2). Accordingly, an (n−2)-th scan signal output through the horizontal scan lines SCLC1 and SCLC2 in the (n−2)-th unit area UA(n−2) may be output to the n-th scan line of the n-th unit area UAn through the first vertical scan line SCL1'.

For example, in case that the n-th unit area UAn is a sixty-seventh unit area, the sixty-seventh unit area may be electrically connected to the five hundred twenty-ninth scan line, and the sixty-fifth unit area which is the (n−2)-th unit area UA(n−2) may be electrically connected to the five hundred thirteenth scan line. The sixty-fifth unit area may be electrically connected to the first scan clock line SC_CKL1 (refer to FIG. 10) to output the sixty-fifth scan signal corresponding to the first scan clock signal. The sixty-fifth scan signal according to an embodiment may be applied to the first vertical scan line SCL1' of the sixty-seventh unit area through the first vertical scan line SCL1', and the first vertical scan line SCL1' of the sixty-seventh unit area may be electrically connected to the five hundred twenty-ninth scan line. Therefore, the scan signal corresponding to the sixty-fifth scan signal may be supplied to the five hundred twenty-ninth scan line of the sixty-seventh unit area. For example, in an embodiment, since the scan signal output from the (n−2)-th unit area (or stage block) is output to a scan line electrically connected to the n-th unit area, a voltage of the scan line of the (n−2)-th unit area (or stage block) may not be affected by the voltage change of the first node. Accordingly, a stain of the display panel may be improved.

The second vertical scan line SCL2' (or a fourth output scan line) may extend in the first direction DR1 in the (n−1)-th unit area UA(n−1), the n-th unit area UAn, and the (n+1)-th unit area UA(n+1) and may be positioned between the second pixel column COL2 and the third pixel column COL3 in the second direction DR2. The second vertical scan line SCL2' may be electrically connected to the horizontal scan lines SCLC1 and SCLC2 in the (n−1)-th unit area UA(n−1). Accordingly, the (n−1)-th scan signal output through the horizontal scan lines SCLC1 and SCLC2 in the (n−1)-th unit area UA(n−1) may be output to the (n+1)-th scan line of the (n+1)-th unit area UA(n+1) through the second vertical scan line SCL2'.

For example, in case that the n-th unit area UAn is the sixty-seventh unit area, the sixty-sixth unit area may be electrically connected to the five hundred twenty-first scan line, and a sixty-eighth unit area which is the (n+1)-th unit area UA(n+1) may be electrically connected to a five hundred thirty-seventh scan line. The sixty-sixth unit area may be electrically connected to the first scan clock line SC_CKL1 (refer to FIG. 10) to output the sixty-sixth scan signal corresponding to the first scan clock signal. The sixty-sixth scan signal according to an embodiment may be applied to the second vertical scan line SCL2' of the sixty-eighth unit area through the second vertical scan line SCL2', and the second vertical scan line SCL2' of the sixty-eighth unit area may be electrically connected to the five hundred thirty-seventh scan line. Therefore, the scan signal corresponding to the sixty-sixth scan signal may be supplied to the five hundred thirty-seventh scan line of the sixty-eighth unit area. For example, in an embodiment, since the scan signal output from the (n−1)-th unit area (or stage block) is output to a scan line electrically connected to the (n+1)-th unit area, a voltage of the scan line of the (n−1)-th unit area (or stage block) may not be affected by the voltage change of the first node. Accordingly, a stain of the display panel may be improved.

The third vertical scan line SCL3' (or a fifth output scan line) may extend in the first direction DR1 in the (n−2)-th unit area UA(n−2), the (n−1)-th unit area UA(n−1), and the n-th unit area UAn and may be positioned between the fourth pixel column COL4 and the fifth pixel column COL5 in the second direction DR2. The third vertical scan line SCL3' may be electrically connected to the horizontal scan lines SCLC1 and SCLC2 in the n-th unit area UA(n−1). Accordingly, the n-th scan signal output through the horizontal scan lines SCLC1 and SCLC2 in the n-th unit area UAn may be output to the (n−2)-th scan line of the (n−2)-th unit area UA(n−2) through the third vertical scan line SCL3'.

For example, in case that the n-th unit area UAn is the sixty-seventh unit area, the sixty-seventh unit area may be electrically connected to the five hundred twenty-ninth scan line, and the sixty-fifth unit area which is the (n−2)-th unit area UA(n−2) may be electrically connected to the five hundred thirteenth scan line. The sixty-seventh unit area may be electrically connected to the first scan clock line SC_CKL1 (refer to FIG. 10) to output the sixty-seventh scan signal corresponding to the first scan clock signal. The sixty-seventh scan signal according to an embodiment may be applied to the third vertical scan line SCL3' of the sixty-fifth unit area through the third vertical scan line SCL3', and the third vertical scan line SCL3' of the sixty-fifth unit area may be electrically connected to the five hundred thirteenth scan line. Therefore, the scan signal corresponding to the sixty-seventh scan signal may be supplied to the five hundred thirteenth scan line of the sixty-fifth unit area. For example, in an embodiment, since the scan signal output from the (n−2)-th unit area (or stage block) is output to the scan line electrically connected to the n-th unit area, the voltage of the scan line of the (n−2)-th unit area (or stage block) may not be affected by the voltage change of the first node. Accordingly, a stain of the display panel may be improved.

The fourth vertical scan line SCL4' (or a sixth output scan line) may extend in the first direction DR1 in the (n−1)-th unit area UA(n−1), the n-th unit area UAn, and the (n+1)-th unit area UA(n+1) and may be positioned between the sixth pixel column COL6 and the seventh pixel column COL7 in the second direction DR2. The fourth vertical scan line SCL4' may be electrically connected to the horizontal scan lines SCLC1 and SCLC2 in the (n+1)-th unit area UA(n+1). Accordingly, the (n+1)-th scan signal output through the horizontal scan lines SCLC1 and SCLC2 in the (n+1)-th unit area UA(n−1) may be output to the (n−1)-th scan line of the (n−1)-th unit area UA(n−1) through the fourth vertical scan line SCL4'.

For example, in case that the n-th unit area UAn is the sixty-seventh unit area, the sixty-eighth unit area may be electrically connected to the five hundred thirty-seventh scan line, and the sixty-sixth unit area which is the (n−1)-th unit area UA(n−1) may be electrically connected to the five hundred twenty-first scan line. The sixty-eighth unit area may be electrically connected to the first scan clock line SC_CKL1 (refer to FIG. 10) to output the sixty-eighth scan signal corresponding to the first scan clock signal. The sixty-eighth scan signal according to an embodiment may be applied to the fourth vertical scan line SCL4' of the sixty-sixth unit area through the fourth vertical scan line SCL4', and the fourth vertical scan line SCL4' of the sixty-sixth unit area may be electrically connected to the five hundred twenty-first scan line. Therefore, the scan signal corresponding to the sixty-eighth scan signal may be supplied to the five hundred twenty-first scan line of the sixty-sixth unit area. For example, in an embodiment, since the scan signal output from the (n+1)-th unit area (or stage block) is output to a scan line electrically connected to the (n−1)-th unit area, a voltage of the scan line of the (n+1)-th unit area (or stage block) may not be affected by the voltage change of the first node. Accordingly, a stain of the display panel may be improved.

For example, the scan signal output through each vertical scan line may be applied to the scan lines of the (n−2)-th or (n+2)-th unit area (or stage block).

Positions of the vertical scan lines and/or the horizontal scan lines shown in FIG. 17 are not fixed, and the positions of the vertical scan lines and/or the horizontal scan lines may be variously modified according to an embodiment.

Although the disclosure has been described with reference to the embodiment above, those skilled in the art will understand that the disclosure may be variously modified and changed without departing from the spirit and technical area of the disclosure described in the claims which will be described later.

Therefore, the technical scope of the disclosure should not be limited to the contents described in the detailed description of the specification, but should also be defined by the claims.

What is claimed is:

1. A display device comprising:
   a display panel including pixels in a display area;
   scan lines disposed in the display area and electrically connected to the pixels;
   a gate driving circuit disposed in the display area and electrically connected to the scan lines; and
   clock lines disposed in the display area and electrically connected to the gate driving circuit, wherein
   the gate driving circuit includes stage blocks adjacent to each other and outputting scan signals in response to a clock signal provided through a corresponding clock line among the clock lines, each of the stage blocks including stages adjacent to each other, and
   a scan signal output from a stage block among the stage blocks is supplied to one or more scan lines electrically connected to another stage block among the stage blocks.

2. The display device according to claim 1, wherein a scan signal output from an n-th stage block among the stage blocks is supplied to one or more scan lines electrically connected to an (n−1)-th stage block.

3. The display device according to claim 1, wherein a scan signal output from an n-th stage block among the stage blocks is supplied to one or more scan lines electronically connected to an (n+1)-th stage block.

4. The display device according to claim 1, wherein a scan signal output from an (n−2)-th stage block among the stage blocks is supplied to one or more scan lines electrically connected to an n-th stage block.

5. The display device according to claim 4, wherein a scan signal output from an (n−1)-th stage block among the stage blocks is supplied to one or more scan lines electrically connected to an (n+1)-th stage block.

6. The display device according to claim 5, wherein a scan signal output from the n-th stage block among the stage blocks is supplied to one or more scan lines electrically connected to the (n−2)-th stage block.

7. The display device according to claim 6, wherein a scan signal output from the (n+1)-th stage block among the stage blocks is supplied to one or more scan lines electrically connected to the (n−1)-th stage block.

8. The display device according to claim 1, wherein a stage block among the stage blocks includes eight stages adjacent to each other in a direction.

9. The display device according to claim 8, wherein the clock lines include a first scan clock line, a second scan clock line, a third scan clock line, a fourth scan clock line, a fifth scan clock line, a sixth scan clock line, a seventh scan clock line, and an eighth scan clock line,
   the first scan clock line, the second scan clock line, the third scan clock line, the fourth scan clock line, the fifth scan clock line, the sixth scan clock line, the seventh scan clock line, and the eighth scan clock line are electrically connected to the eight stages, respectively, and
   each of the eight stages outputs the scan signal in response to a scan clock signal provided through the first scan clock line, the second scan clock line, the third scan clock line, the fourth scan clock line, the fifth scan clock line, the sixth scan clock line, the seventh scan clock line, and the eighth scan clock line.

10. The display device according to claim 9, wherein the scan lines include a first scan line, a second scan line, a third scan line, a fourth scan line, a fifth scan line, a sixth scan line, a seventh scan line, and an eighth scan line, and
    the first scan line, the second scan line, the third scan line, the fourth scan line, the fifth scan line, the sixth scan line, the seventh scan line, and the eighth scan line are respectively electrically connected to the one or more scan lines electrically connected to the another stage block among the stage blocks.

11. A display device comprising:
    a display panel including unit areas in which pixel rows and pixel columns are disposed;
    scan lines disposed in the unit areas and electrically connected to the pixel rows;
    output scan lines disposed in at least a unit area among the unit areas; and
    a gate driving circuit including gate driving elements disposed in the unit areas, and outputting scan signals by the gate driving elements, each of the unit areas including stages adjacent to each other,
    wherein a scan signal output from a unit area among the unit areas is supplied to one or more scan lines in another unit area among the unit areas through an output scan line among the output scan lines.

12. The display device according to claim 11, wherein a scan signal output from an n-th unit area among the unit areas is supplied to one or more scan lines in an (n−1)-th unit area among the unit areas through a first output scan line among the output scan lines, and
    the first output scan line is disposed in the n-th unit area and the (n−1)-th unit area.

13. The display device according to claim 11, wherein a scan signal output from an n-th unit area among the unit areas is supplied to one or more scan lines in an (n+1)-th unit area among the unit areas through a second output scan line among the output scan lines, and
    the second output scan line is disposed in the n-th unit area and the (n+1)-th unit area.

14. The display device according to claim 11, wherein a scan signal output from an (n−2)-th unit area among the unit areas is supplied to one or more scan lines in an n-th unit area among the unit areas through a third output scan line among the output scan lines, and
    the third output scan line is disposed over the (n−2)-th unit area to the n-th unit area.

15. The display device according to claim 14, wherein a scan signal output from an (n−1)-th unit area among the unit areas is supplied to one or more scan lines in an (n+1)-th unit area among the unit areas through a fourth output scan line among the output scan lines, and
    the fourth output scan line is disposed over the (n−1)-th unit area to the (n+1)-th unit area.

16. The display device according to claim 15, wherein a scan signal output from the n-th unit area among the unit areas is supplied to one or more scan lines in an (n−2)-th unit area among the unit areas through a fifth output scan line among the output scan lines, and the fifth output scan line is disposed over the n-th unit area to the (n−2)-th unit area.

17. The display device according to claim 16, wherein a scan signal output from the (n+1)-th unit area among the unit areas is supplied to one or more scan lines in the (n−1)-th unit area through a sixth output scan line among the output scan lines, and the sixth output scan line is disposed over the (n+1)-th unit area to the (n−1)-th unit area.

18. The display device according to claim 11, further comprising:

clock lines electrically connected to the gate driving circuit and supplying a clock signal corresponding to the gate driving circuit, wherein the gate driving circuit outputs the scan signal in response to the clock signal.

19. The display device according to claim 18, wherein the clock lines include a first scan clock line, a second scan clock line, a third scan clock line, a fourth scan clock line, a fifth scan clock line, a sixth scan clock line, a seventh scan clock line, and an eighth scan clock line, the first scan clock line, the second scan clock line, the third scan clock line, the fourth scan clock line, the fifth scan clock line, the sixth scan clock line, the seventh scan clock line, and the eighth scan clock line are electrically connected to the gate driving circuit, respectively, and the gate driving circuit outputs the scan signal in response to the scan clock signal provided through the first scan clock line, the second scan clock line, the third scan clock line, the fourth scan clock line, the fifth scan clock line, the sixth scan clock line, the seventh scan clock line, and the eighth scan clock line.

20. The display device according to claim 19, wherein the scan lines include a first scan line, a second scan line, a third scan line, a fourth scan line, a fifth scan line, a sixth scan line, a seventh scan line, and an eighth scan line, and the first scan line, the second scan line, the third scan line, the fourth scan line, the fifth scan line, the sixth scan line, the seventh scan line, and the eighth scan line are respectively electrically connected to the one or more scan lines in the another unit area among the unit areas.

* * * * *